United States Patent
Wachi et al.

(10) Patent No.: US 6,800,589 B2
(45) Date of Patent: Oct. 5, 2004

(54) IMAGE-FORMING MATERIAL AND IMAGE FORMATION METHOD

(75) Inventors: Naotaka Wachi, Shizuoka (JP); Mitsuru Yamamoto, Shizuoka (JP); Akira Hatakeyama, Shizuoka (JP); Susumu Sugiyama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 168 days.

(21) Appl. No.: 10/060,140

(22) Filed: Feb. 1, 2002

(65) Prior Publication Data

US 2003/0035935 A1 Feb. 20, 2003

(30) Foreign Application Priority Data

| Feb. 2, 2001 | (JP) | P. 2001-027143 |
| Mar. 16, 2001 | (JP) | P. 2001-076561 |
| Mar. 19, 2001 | (JP) | P. 2001-079556 |
| Jan. 29, 2002 | (JP) | P. 2002-019465 |

(51) Int. Cl.⁷ .................... B41M 5/035; B41M 5/38
(52) U.S. Cl. ................. 503/227; 428/32.39; 428/32.51; 430/945
(58) Field of Search ............ 503/227; 428/32.39, 428/32.5, 32.52, 32.51; 430/945

(56) References Cited

U.S. PATENT DOCUMENTS

| 5,580,693 A | 12/1996 | Nakajima et al. |
| 6,027,850 A | 2/2000 | Kawakami et al. |

FOREIGN PATENT DOCUMENTS

| JP | 8-337053 A | 12/1996 |
| JP | 8-337054 A | 12/1996 |
| JP | 11-143063 A | 5/1999 |
| JP | 2000-118144 A | 4/2000 |
| JP | 2000-127635 A | 5/2000 |
| JP | 2000-127636 A | 5/2000 |
| JP | 2000-355176 A | 12/2000 |

*Primary Examiner*—B. Hamilton Hess
(74) *Attorney, Agent, or Firm*—Sughrue Mion, PLLC

(57) ABSTRACT

An image-forming material comprising: an image-receiving sheet comprising a support and an image-receiving layer and; a thermal transfer sheet comprising a support, alight-to-heat conversion layer and an image-forming layer, wherein an outermost surface of the side of the thermal transfer sheet in which the image-forming layer is provided has a scratch resistance of from 50 g to 200 g at the time that the surface is scratched with a stylus having a radius of curvature of 0.25 mm at a velocity of 1 cm/sec and a method using the image-forming material.

14 Claims, 2 Drawing Sheets

FIG. 1-(a)
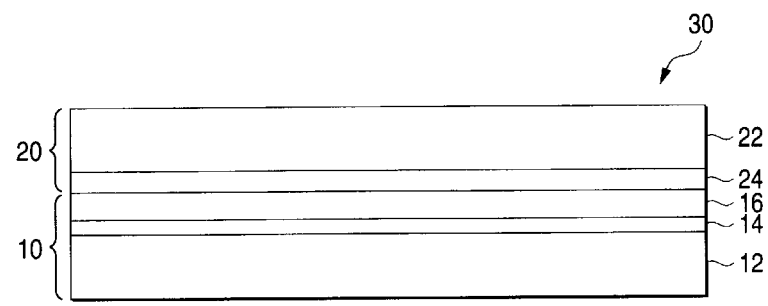
FIG. 1-(b)
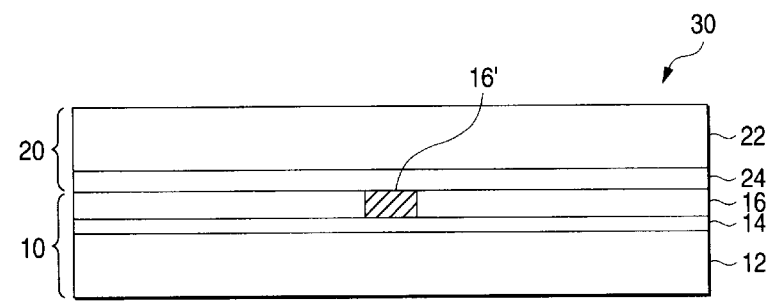
↑ hv
FIG. 1-(c)
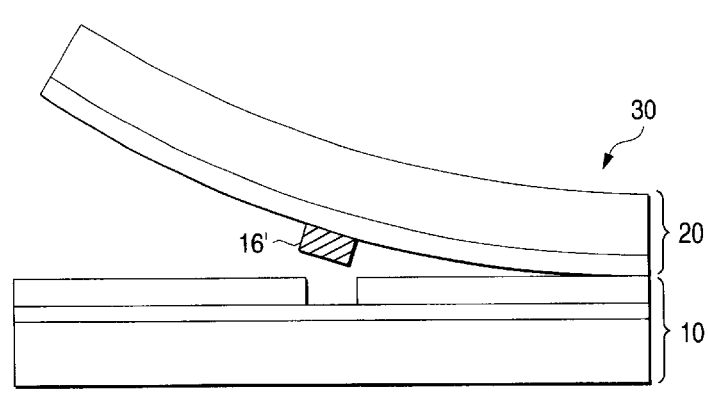

IMAGE-FORMING MATERIAL AND IMAGE FORMATION METHOD

FIELD OF THE INVENTION

The present invention relates to an image-forming material comprising a thermal transfer sheet and an image-receiving sheet, and specifically an image-forming material and image formation process that provide high-resolution full color images with use of laser light. More specifically, the invention relates to an image-forming material and image formation process useful for the production of color proofs (DDCP, direct digital color proof) in the graphic arts field or mask images by laser recording based on digital image signals.

BACKGROUND OF THE INVENTION

In the graphic arts industry, a set of printing plates are prepared with use of a set of color separation film images made with lith films from a color original. In general, prior to the actual press operation, in order to check possible errors in color separation procedures and the necessity of color correction, color proofs are made from the color separation film images. Color proofing materials are expected to have a high resolution needed for faithful reproduction of halftone images and an out standing process stability. Further, to obtain color proofs that well simulate actual printed matters, they should preferably be made of the actual printing stock as the substrate, and pigments as the coloring agents both used for the actual press operation. Still further, color proofs should preferably be produced by a dry process with out using a developer liquid.

Various image-recording systems are being developed that can produce color proofs via a dry process directly from digital signals along with the prevalence of electronic systems in pre-press works in these days. Such electronic systems aim at the production of high-quality color proofs generally reproducing halftone images of 150 lines per inch or higher. To reproduce high-quality proof images from digital signals, a laser light is used as recording energy because of its capability of modulation by digital signals and realization of an extremely fine beam. Accordingly, the development of recording materials that exhibit a sufficiently high recording sensitivity to a laser light and a high resolution enabling a precise reproduction of minute halftone dots are demanded.

As the recording material used for image transfer processes based on a laser light, a thermally meltable transfer sheet is set forth in Japanese Patent Laid-Open No. 58045/1993 which comprises a substrate, a light-to-heat conversion layer generating heat by laser light absorption and an image-forming layer containing a pigment dispersed in a thermally meltable wax or binder, both layers being provided on the substrate in this order. In the image-forming process using such a recording material, the heat generated at the laser-irradiated area of the light-to-heat conversion layer melts the image-forming layer at the corresponding area, and the melted layer is transferred onto an image-receiving sheet superimposed on the transfer sheet to form a transferred image.

Japanese Patent Laid-Open No. 219052/1994 discloses a thermal transfer sheet comprising a light-to-heat conversion layer containing a light-to-heat conversion material, a very thin (0.03 to 0.3 $\mu$m thick) thermal stripping layer, and an image-forming layer containing a colorant, all provided on a substrate in this order. When a laser light is irradiated on this type of thermal transfer sheet, the bonding force between the image-forming layer and the light-to-heat conversion layer secured by the presence of the thermal stripping layer is reduced, and thus a high-quality image is formed on an image-receiving sheet superimposed on the thermal transfer sheet. This image formation process makes use of the so-called 'abrasion' phenomenon; i.e., at the area where the laser light was irradiated, the thermal stripping layer is partly vaporized by decomposition to weaken the bonding between the image-forming layer and the light-to-heat conversion layer there, thus causing the image-forming layer at the irradiated area to be transferred onto the image-receiving sheet superimposed on the thermal transfer sheet.

These image formation processes have a number of advantages including the capability of using an actual printing stock coated with an image-receiving (adhesive) layer as the image-receiving sheet material and the ease with which it can produce multi-color images by simply sequentially transferring differently colored images on a single image-receiving sheet. In particular, the abrasion-based image formation process, which has a prominent feature of readily producing high-quality images, is useful for the preparation of color proofs (DDCP: Direct Digital Color Proofs) and high-resolution mask images.

When a thermal transfer sheet for use in color image formation gives image defects, the commercial value thereof is noticeably damaged. One reason of image defect generation is the damage of the image-forming layer causing a partial lack of the layer. At such lacking areas, no image transfer takes place thus giving rise to a void in an image. The thermal transfer sheet undergoes such damages during manufacture, processing or image recording due to the rubbing of the front surface of the sheet against the rear surface thereof, for example, in an image-recording apparatus. Especially when the area of the image is large, the probability of image defect generation rises in proportion to the image area. Accordingly the more scarce defect generation is demanded for thermal transfer sheets used for the production of the larger images.

To prevent the generation of such image defects, Japanese Patent Laid-Open No. 270154/1993 discloses a method of using a specified polyester and an acrylate-styrene copolymer as the binder of the image-forming layer. Alternatively, prevention of image defect generation by providing a protective coating on the image-forming layer is also in practical use.

Although one can decrease the frequency of defect generation to some extent with these countermeasures, images of large areas are still accompanied by a practical trouble since the number of image defects is proportional to the image area. Moreover, introduction of a protective layer that can suppress the generation of image defects suffers from the drawback that a large amount of recording energy is required for thermal image transfer.

As another problem, a light-to-heat conversion layer comprising carbon black used as the light-to-heat conversion material, which is preferred as regard to the material cost and the absorption efficiency for laser lights, has a drawback that the image-forming layer provided on the light-to-heat conversion layer is susceptible to mechanical damaging because of the insufficient cohesive energy of the light-to-heat conversion layer. Though the mechanical damages caused by the use of such carbon black-based light-to-heat conversion layer may be prevented by raising the scratch resistance of the image-forming layer, there arises another problem of an insufficient reflection optical density of the transferred image.

Still another type of trouble exists as for image defects. Recently, multi-beams of a laser light are used for laser image recording for the purpose of curtailing the recording time. When a conventional thermal transfer sheet is exposed to a multi-beam laser light for image recording, various troubles associated with image defects tend to occur such as transfer of the light-to-heat conversion layer onto the image-receiving sheet or transfer of the image-forming layer at non-irradiated areas instead of transfer at irradiated areas (reversal mode transfer). Furthermore, the thermal transfer sheets must be handled with a great care so as to cause no peeling-off or damaging of the image-forming layer thereof, which has demanded a high skill for the operator.

As has been pointed out previously, the image-forming material of the invention is expected to be provided with a high process stability. For example, the material must exhibit desirable conveyance and stacking properties since multiple image-receiving sheets must be stacked up after recording.

SUMMARY OF THE INVENTION

To cope with the situation described hereinabove, the object of the invention is to provide an image-forming material comprising a thermal transfer sheet that can prevent the generation of image defects even when the image area is large or when carbon black is used in the light-to-heat conversion layer and that can form thermally transferred images of a sufficiently high optical reflection density.

Another object of the invention is to provide an image-forming material comprising a thermal transfer sheet that undergoes a desirable image transfer only laser-irradiated areas when a multi-beam laser light with high energy density is used to provide images on an image-receiving sheet, and that is provided with an improved handling property.

Still another object of the invention is to provide an image-forming material comprising an image-receiving sheet used for an image formation process based on abrasion, the image-receiving sheet excelling in conveyance and stacking properties and capable of readily forming high-resolution images suited for color proofs and precise masks with a high process stability.

The invention also aims to provide an image formation process using such improved thermal transfer sheets and image-receiving sheets as described hereinabove.

The above-cited objects can be achieved by the materials and process described in the following.

(1) An image-forming material comprising an image-receiving sheet having at least an image-receiving layer on a substrate and plural differently colored thermal transfer sheets each having at least a light-to-heat conversion layer and an image-forming layer on a substrate, the outermost surface of the side of said thermal transfer sheet in which said image-forming layer is provided exhibiting a scratch resistance of 50 to 200 g when said surface is scratched with a stylus with a radius of curvature of 0.25 mm at a velocity of 1 cm/sec.

(2) An image-forming material set forth in (1) in which said scratch resistance is 100 to 200 g.

(3) An image-forming material set forth in (1) or (2) in which the area of an image formed in said image-forming layer is at least 1000 cm$^2$.

(4) An image-forming material set forth in (1) to (3) in which said thermal transfer sheet is used to form a color image on the image-receiving sheet.

(5) An image-forming material set forth in (1) to (4) in which the outermost surface of the side on which said image-forming layer is provided is that of said image-forming layer itself.

(6) An image-forming material set forth in (1) to (5) in which said light-to-heat conversion layer contains carbon black.

(7) An image-forming material set forth in (1) that exhibits a peeling force of 5.9 N/m to 0.5 N/m when the light-to-heat conversion layer of said thermal transfer sheet and the image-forming layer are peeled off from the substrate of the thermal transfer sheet with a peeling angle of 90 deg and at a peeling velocity of 500 mm/min after the image-receiving layer of said image-receiving sheet is brought into face-to-face contact with the image-forming layer of said thermal transfer sheet, and then the laminated body is subjected to laser light irradiation from the substrate side of the thermal transfer sheet.

(8) An image-forming material set forth in (7) that exhibits a peeling force of at least 0.98 N/m when the light-to-heat conversion layer and the image-forming layer of said thermal transfer sheet are peeled off from the substrate of said thermal transfer sheet with a peeling angle of 90 deg at a peeling velocity of 500 mm/min before the thermal transfer sheet is brought into contact with the image-receiving layer of said image-receiving sheet.

(9) An image-forming material set forth in (8) in which the peeling force described in (8) is larger than the value set forth in (7).

(10) An image-forming material set forth in (1) in which the dynamic frictional force of the surface (image-receiving surface) having the image-receiving layer of said image-receiving sheet and that opposite to said surface (back surface) do not exceed 40 gf, and in which the surface roughness Rz of said image-receiving surface does not exceed 4 μm, and in which the surface roughness Rz of said back surface does not exceed 8 μm.

(11) An image-forming material set forth in (10) in which the surface roughness Rz of said image-receiving surface does not exceed 3 μm, and in which the surface roughness Rz of said back surface does not exceed 5 μm.

(12) An image-forming method using an image-forming material comprising an image-receiving sheet having at least an image-receiving layer on a substrate and four or more kinds of yellow, magenta, cyan and black thermal transfer sheets comprising, the method comprising superimposing each of said thermal transfer sheets on said image-receiving sheet in such a manner that the image-forming layer of said image-forming sheet and the image-receiving layer of said image-receiving sheet is in direct contact, exposing the superimposed laminate to a laser light to transfer the laser-irradiated region of said image-forming layer onto the image-receiving layer of said image-receiving sheet, thus forming an image wherein said image-forming material is selected from those set forth in one of (1) to (11).

(13) A method of forming a color proof in which a multi-color image formed on the image-receiving layer by the method set forth in (12) is again transferred together with the image-receiving layer onto an actual printing stock.

BRIEF DESCRIPTION OF THE DRAWINGS

[FIG. 1-(a) to (c)]

FIGS. 1-(a), 1-(b) and 1-(c) are drawings schematically describing the mechanism of multi-color image formation based on thin film laser thermal transfer.

FIG. 2 illustrates an example of the configuration for a recording apparatus based on laser thermal image transfer.

DESCRIPTION OF THE REFERENCE NUMERALS AND SIGNS

Figure 2:
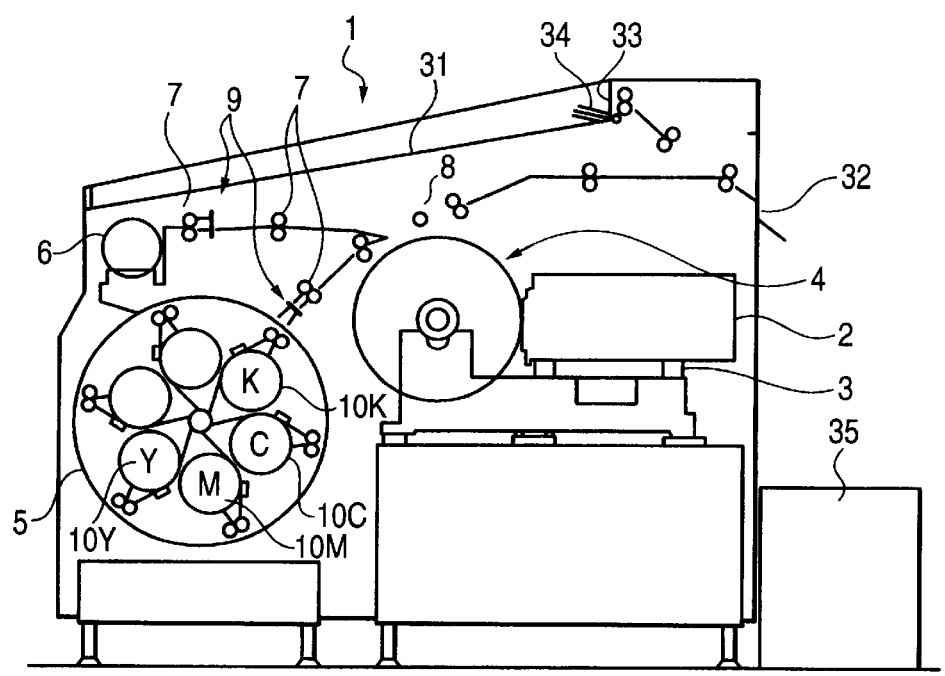
[FIG. 2]

1 Recording apparatus
2 Recording head
3 Sub-scanning rail
4 Recording drum
5 Loading unit for thermal transfer sheets
6 Image-receiving sheet roll
7 Transport roller
8 Squeeze roller
9 Cutter
10 Thermal transfer sheet
10K, 10C, 10M and 10Y Thermal transfer sheet rolls
12 Substrate
14 Light-to-heat conversion layer
16 Image-forming layer
20 Image-receiving sheet
22 Substrate for image-receiving sheet
24 Image-receiving layer
30 Laminated body
31 Exhaust tray
32 Disposing exit
33 Exhaust exit
34 Air
35 Disposal box

DETAILED DESCRIPTION OF THE INVENTION

The image-forming material of the invention, which comprises an image-receiving sheet having at least an image-receiving layer on a substrate and plural differently colored thermal transfer sheets each having at least a light-to-heat conversion layer and an image-forming layer on a second substrate, is characterized by that the outermost surface of the side of said thermal transfer sheet on which said image-forming layer is provided exhibits a scratch resistance of 50 to 200 g when said surface is scratched by a stylus with a radius of curvature of 0.25 mm at a velocity of 1 cm/sec.

The term, scratch resistance, in the invention means the minimal load necessary for a sapphire stylus with a radius of curvature of 0.25 mm to break the image-forming layer and reach the interface between the image-forming layer and the light-to-heat conversion layer when the stylus placed vertical to the surface scratches the surface of the thermal transfer sheet with a gradually increasing load at a velocity of 1 cm/sec. This measurement must be performed in an atmosphere of 25° C. and 60% RH with a sample having been kept in this atmosphere for 24 hours.

The scratch resistance of 50 to 200 g is necessary, but 100 to 200 g is preferred.

Any method of adjusting the scratch resistance into the above-cited range may be adopted without restriction including the following.

1. Use of a Slipping Agent

A slipping agent is preferably incorporated in the layer constituting the surface of the thermal transfer sheet (i.e., a protective layer or an image-forming layer), but it is especially preferred to incorporate it at least into the image-forming layer. From the viewpoint of recording sensitivity, the slipping agent should be preferably incorporated into the image-forming layer of the thermal transfer sheet in which the image-forming layer constitutes the outermost layer thereof.

Waxes are preferably used as the slipping agent.

Waxes include mineral-based ones, those of natural origin and synthetic ones. Mineral-based waxes include petroleum waxes such as paraffin wax, micro-crystalline wax, ester wax and oxidized wax, montan wax, ozocelite and ceresine. Among these, paraffin wax is preferred, which is extracted from petroleum. Various products classified by the melting point are commercially available.

Waxes of natural origin include plant waxes exemplified by carnauba wax, wood wax, oulikyuri wax and esparu wax, and animal waxes exemplified by bees wax, insect wax, shellac wax and whale wax.

Synthetic waxes include the following.

1) Fatty Acid-related Wax

The linear-chain, saturated fatty acid represented by the following general formula:

$$CH_3(CH_2)_nCOOH$$

In the formula, n represents an integer of 6 to 28, preferably 10 to 30. Specific examples include stearic acid, behenic acid, palmitic acid, 12-hydroxystearic acid and azelaic acid.

The metal (e.g., K, Ca, Zn and Mg) salt of the fatty acid cited above is also included.

2) Fatty Acid Ester Wax

Specific examples of the fatty acid ester wax include ethyl stearate, lauryl stearate, ethyl behenate, hexylbehenate, behenyl myristate and glycerol esters.

3) Fatty Acid Amide Wax

Specific examples of the amide of the above-cited fatty acids include stearylamide and laurylamide.

4) Aliphatic Alcohol Wax

The linear-chain, saturated aliphatic alcohol represented by the following general formula:

$$CH_3(CH_2)_nOH$$

In the formula, n represents an integer of 6 to 28. Specific examples include stearyl alcohol.

5) Polymer Wax

Polyethylenes with number-averaged molecular weights of 200 to 10,000 are included.

Among the synthetic waxes of 1) to 5), behenic acid, glycerol higher fatty acid mono-esters, higher fatty acid amides such as stearylamide and laurylamide are particularly suited.

Other slipping agents include silicone oils and modified silicone oils. For example, those with molecular weights of from 150 to 5,000 can be used. Specific examples include dimethylsilicon oil, alkyl- or aralkyl-modified silicone oils, alkyl-modified silicone oils, methylhydrogensilicon oils, methylphenylsilicon oils, cyclic polydimethylsiloxane, polyether-modified silicone oils, polyether-modified silicone oils, carbinol-modified silicone oils, amino-modified silicone oil, alkyl/polyether-modified silicone oil, epoxy-modified silicone oil and fluorine-modified silicone oils.

These slipping agents can be used individually or in combination thereof.

The slipping gent is preferably contained in the image-forming or protective layer in an amount of 0.01 to 15% by weight and more preferably 0.1 to 5% by weight.

The slipping agent, particularly the wax compound also has a function of controlling the image transfer property onto the image-receiving sheet as will be described hereinafter.

2. Control of Pigment Particle Size

The scratch resistance of the image-forming layer can be modulated by controlling the particle size of the pigment incorporated therein.

A preferable range of the average pigment particle size preferably lies in the range of 0.2 to 0.6 µm, more preferably 0.25 to 0.5 µm measured by a dynamic light scattering method (N-4, a dynamic light scattering measuring apparatus made by Coulter, Ltd.).

When the average particle size is below 0.2 µm, the cost required for pigment dispersion rises, or the pigment dispersion tends to gel, leading to sensitivity deterioration. On the other hand, with sizes over 0.6 µm, the scratch resistance lowers, and coarse pigment particles hinder the adhesion of the image-forming layer to the image-receiving layer. Moreover, the transparency of the image-forming layer deteriorates in some cases.

The image-forming layer preferably contains a pigment at a content of 30 to 70% by weight, more preferably 30 to 50% by weight. The image-forming layer preferably contains a resinous material at a content of 70 to 30% by weight, more preferably 70 to 40%.

As has been explained heretofore, by adjusting the scratch resistance of the side of the thermal transfer sheet in which the image-forming layer is into the above-specified range, image defects associated with mechanical damages can be prevented and at the same time thermal transferred images of a high reflection optical density can be obtained.

As a preferable embodiment of the invention, the peeling force between the light-to-heat conversion layer and the image-forming layer after laser irradiation of the image-forming material can be adjusted in a specified range.

The peeling force of the thermal transfer sheet related to such embodiment means the value measured by the following method.

Around a rotary drum, the image-receiving sheet is wounded, and adsorbed by vacuum. Then the thermal transfer sheet is superimposed on the image-receiving sheet so that the thermal transfer sheet entirely covers the image-receiving sheet with excessive margins uniformly expanding crossing each edge of the image-receiving sheet. The two sheets are intimately contacted with a squeeze roller to form a stacked laminate. Then, the drum is rotated. A semiconductor laser beam of 808 nm wavelength is condensed so as to give a 7 µm diameter spot on the surface of the light-to-heat conversion. Such beams are directed for image recording toward the laminate on the rotating drum from the substrate-side of the laminate. During image recording, the beams are moved for sub-scanning in the direction perpendicular to the rotating direction of the drum (main scanning). With such a configuration, a solid image with a uniform density is recorded in the laminate. Apiece of the recorded laminate, 2.9 cm wide and 13 cm long, is cut out and used for peeling force measurement. Here, the width is taken along the direction of the drum axis while the length is taken along the direction perpendicular to the drum axis. The laser irradiation conditions are shown below. The laser exposure was performed with two-dimensionally arranged multi-beams forming a parallelogram comprising five beams along the main scanning direction and three beams along the sub-scanning direction.

| Laser power | 110 mW |
| Main scanning rate | 6 m/sec |
| Sub-scanning pitch | 6.35 µm |

Surrounding atmospheric condition 23° C., 50% RH

The sample for measurement, which is prepared by bonding the piece of the laminate to a copper plate, was loaded in a measuring apparatus, Tensilon (RTM-100 made by Orientec Corp.) With the side edge of the sample firmly retained, the light-to-heat conversion layer is peeled off from the image-forming layer with a peeling angle of 90 deg at a peeling rate of 500 mm/min along the longitudinal direction. It should be noted that the image-forming layer is separated from the substrate-side of the thermal transfer sheet.

In this embodiment of the invention, the peeling force of the thermal transfer sheet after laser exposure (which will be called post-exposure peeling force hereinafter) is regulated in the range of 0.5 to 5.9 N/m, preferably 1.0 to 4.9 N/m.

It is further preferred to regulate the peeling force of the isolated thermal transfer sheet prior to laser exposure (which will be called pre-exposure peeling force hereinafter) not lower than 0.98 N/m, preferably 2.0 N/m. In other words, the pre-exposure peeling force should preferably be regulated so as to be larger than the post-exposure one.

Pre-exposure peeling forces can be measured by replacing the laminate used in the measurement of post-exposure peeling forces to an isolated thermal transfer sheet, bonding the image-forming layer thereof onto a copper plate to prepare a sample, which is loaded in the same measuring apparatus, Tensilon (RTM-100 made by Orientec Corp.), and subjected to the same measurement.

The means to regulate the peeling forces in the invention includes appropriate selection and content control of the ingredients of the light-to-heat conversion layer and the image-forming layer such as a finely divided material, a binder and a wax. By adjusting the peeling forces in the above-cited ranges, not only the handling property of the thermal transfer sheet is improved, but also the undesirable transfer of the light-to-heat conversion layer onto the image-forming layer as well as the reversal mode transfer of the image-forming layer onto the light-to-heat conversion layer is effectively prevented. Accordingly, high quality images can be formed on the image-receiving sheet.

As has been described heretofore, by adjusting the peeling force of the image-forming layer from the light-to-heat conversion layer, the image-forming layer is transferred onto the image-receiving sheet only at the areas irradiated with laser light even when a high energy density, multi-beam laser light is used for recording. Simultaneously, the handling property of the thermal transfer sheet is improved.

With use of the image-forming material of the invention, an image is formed by superimposing the thermal transfer sheet and the image-receiving sheet in such a manner that the image-forming layer of the former is brought into contact with the image-receiving layer of the latter, and irradiating a laser light to the laminate thus formed whereby the irradiated area of the image-forming layer is transferred to form an image on the image-receiving layer of the latter. In one embodiment of the invention, the dynamic frictional force and the surface roughness of the image-receiving sheet are adjusted in specified ranges for the improvement of the conveyance and stacking properties of the sheet during such mode of recording.

Specifically, in the embodiment of the invention, the dynamic frictional force between the side of image-receiving sheet having the image-receiving layer (image-receiving side surface) and that opposite thereto (back surface) is adjusted to not exceeding 40 gf, preferably 30 gf. Further, the surface roughness Rz of the image-receiving side surface should not exceed 4 µm, preferably 3 µm, while the surface roughness Rz of the back surface should be not larger than 8 µm, preferably not larger than 5 µm.

The dynamic frictional force between the image-receiving side and back surfaces governs the stacking behavior of plural recorded image-receiving sheets that are stacked on the exhaust tray of the recording apparatus to be described later. And when the image-receiving sheet with a dynamic frictional force lying in the range cited above, the sheet exhibits excellent conveyance and stacking properties.

How the dynamic frictional force is measured is described in detail in EXAMPLES hereinbelow.

In order to regulate the dynamic frictional force between the image-receiving surface and the back surface, the following methods can be adopted.

The image-receiving surface is roughened by the incorporation of a matting agent, making use of reticulation phenomena taking place during the coating and drying operations, or embossing treatment. The image-receiving layer is coated with a slipping agent and/or an antistatic agent typically exemplified by surfactants. The physical properties associated with the image-receiving layer including the Tg of the binder and the surface energy are appropriately designed. Other measures for adjusting the dynamic frictional force between the image-receiving surface and the back surface within the above-cited range include the roughening of the back surface by coating it with a matting agent, blending a matting agent into the substrate or through an embossing treatment, or coating the back surface with a slipping agent or an anti-static agent or blending a slipping agent into the substrate. Alternatively, it is also effective to promote the bleeding of a slipping agent or an anti-static agent toward the image-forming surface and/or the back surface by heating the substrate prior to the layer formation or heating the finished image-receiving sheet.

The surface roughness Rz in the specification means the value averaged over ten points in conformity with the Rz (the maximum height) defined by JIS. In the derivation of JIS Rz, a reference plane is defined as the plane averaged over a standard area cut from the rough surface in concern. Then, the distances between the reference plane and the highest to fifth highest peaks and those between the reference plane and the deepest to fifth deepest valleys are averaged to give the value of Rz. The measurement is made with a tracing stylus-type, three-dimensional roughness meter (Surfcom 570A-3DF, a product of Tokyo Seimitsu Co., Ltd.). The measurement is made along the longitudinal (machine) direction, with a cut-off value of 0.08 mm, a measuring area of 0.6 mm×0.4 mm, a shifting pitch of 0.005 mm and a measuring speed of 0.12 mm/s.

Methods of adjusting the surface roughness Rz of the image-receiving or back surface within the above-cited range include those described above.

By combining the dynamic frictional force between the image-receiving surface and the back surface lying in the above-cited range, with the values of Rz for these two surfaces lying in the above-cited range, the conveyance and stacking properties of the image-receiving sheet become desirable. When either of the two conditions is not satisfied, such advantageous features of the image-receiving sheet are not achieved (even if the other condition is satisfied).

In the CTP (Computer-To-Plate) era, lith films become unnecessary, and thus contract proofs are required instead of press proofs and analog-type color proofs. The present inventors have devised a DDCP system which exhibits the same color reproduction capability as the actual printed matter and analog-type color proofs, and is applicable to the production of contract proofs that are used to acquire the approval of customers. Moreover, such DDCP systems are based on pigment colorants common to those for printing inks, capable of transferring images on actual printing stocks, and free of moires. This DDCP system is characterized by a high similarity to actual printed matters and the largeness of size (A2 to B2). The invention provides a thermal transfer sheet preferably used for laser thermal thin film transfer processes, performing halftone dot recording, and capable of transferring images onto actual printing stocks.

The invention is effective and suited for the systems that conduct crisp and sharp dot image formation by thermal transfer onto preferably actual printing stocks and can cope with formats of 1000 $cm^2$ or larger, in particular the B2 size (515 mm×728 mm) recording (Note, however, that the B2 format is 543 mm×765 mm.).

The halftone dot density of the thermal transfer image can be adjusted to a targeted printing line density with use of 2400 to 2540 dpi resolutions. Since each dot is extremely crisp and sharp substantially free of blur and void, the system can reproduce clear dots covering extreme highlights to extreme shadows. As a result, the system can output halftone dot images with the same high resolution as those of image-setters or CTP setters.

The thermal transfer image can faithfully reproduce the exposed pattern of laser beams into sharp dots, and exhibits a high reproducibility of hue and image density under various surrounding atmospheres with widely changing temperatures and humidities since the dependence of the recording characteristics of the system on the surrounding temperature and humidity is very weak.

Further, since the system can output, with high consistency and stability, thermal transfer images composed of the pigment-based coloring agents used for printing inks, one can achieve a high-precision color management system (CMS)

Still further, the system can output thermal transfer images which colors precisely match the hues of Japan color and SWOP color, i.e., those of actual printed matters. And such colors exhibit the same color shifts as actual printed matters when fluorescent lamps or incandescent lamps are used as the light source for observation.

Due to the dot sharpness of the thermal transfer image, the image-forming material can crisply reproduce extremely fine lines composing small size letters. When the heat generated by laser irradiation is conducted to the layer interface without lateral diffusion, the image-forming layer sharply breaks at the barrier between a heated area and a unheated area. To achieve such a condition, the light-to-heat conversion layer of the thermal transfer sheet is made as thin as possible and the dynamic property of the image-forming layer is optimized.

Simulations show that, when an IR-absorbing dye is used in the light-to-heat conversion layer, the temperature of the layer is estimated to reach instantaneously about 700° C. Accordingly, a thin light-to-heat conversion layer is liable to be deformed or destroyed. In such cases, the light-to-heat conversion layer tends to be transferred together with the image-transfer layer onto the image-receiving sheet, or makes the transferred image non-uniform. On the other hand, to achieve a pre-determined temperature, the light-to-heat conversion material must be incorporated in the layer at a high concentration whereby the dye as the conversion material tends to separate or migrate to adjacent layers.

It is thus preferred to make the light-to-heat conversion layer as thin as below about 0.5 $\mu$m thick with use of an IR-absorbing dye excelling in light-to-heat conversion efficiency in combination with a heat-resistant binder such as a polyimide resin.

Generally speaking, in cases where the light-to-heat conversion layer deforms, or the image-forming layer itself deforms by an extremely high temperature, the image-forming layer transferred onto the image-receiving layer is accompanied by a thickness fluctuation corresponding to the sub-scanning pattern of the laser exposure, leading to a density non-uniformity exhibiting an insufficient apparent transfer density. This trouble becomes more noticeable with a thinner image-forming layer. On the other hand, thicker image-forming layers output dots with insufficient sharpness, exhibiting a reduced recording sensitivity.

To make these two properties consistent, it is preferred to incorporate a low melting point material such as waxes in the image-forming layer since the material can suppress the non-uniformity in image transfer. Alternatively, incorporation of a matting agent such as inorganic fine particles instead of the binder helps the image-forming layer sharply fracture at the heated/unheated boundary via appropriately increased layer thickness. Accordingly, without sacrificing dot sharpness as well as recording sensitivity, one can improve the uniformity in image transfer.

Low melting point materials such as waxes generally tend to bleed toward the surface of the image-forming layer, or crystallize, causing troubles associated with image quality and the storage stability of the thermal transfer sheet.

To cope with the troubles, low melting point materials that have solubility parameter (Sp) values close to that of the polymer contained in the image-forming layer are preferably used whereby the low melting point material is prevented from separation from the image-forming layer since the compatibility of the low melting point material with the polymer is high enough. It is further preferred to blend several kinds of low melting point materials of different structures that form an eutectic mixture for the purpose of crystallization prevention. With these countermeasures, highly uniform images composed of sharp and crisp dots can be formed.

The coated layers of the thermal transfer sheet undergo changes in their mechanical and thermal properties when they absorb moisture. Therefore, the image-recording characteristics exhibit a humidity dependence.

To minimize such temperature and humidity dependences of the light-to-heat conversion layer containing a dye acting as the light-to-heat conversion material, the dye/binder system should preferably be composed of materials soluble in organic solvents. In such cases, the binder of the image-forming layer should also be composed of materials soluble inorganic solvents. Moreover, poly(vinyl butyral) is preferably selected as the binder of the image-forming layer whereby a technique that enhances the hydrophobic nature of the polymer is preferably applied in order to further suppress the moisture-absorbing property of poly(vinyl butyral). Hydrophobicity enhancing techniques include one based on the reaction of the hydroxyl group of the polymer with a hydrophobic group as set forth in Japanese Patent laid-Open no. 238858/1996, and another one based on the cross-linking of two or more of the hydroxyl groups with a cross-linking agent.

Some of the conventionally used pigments in the image-forming layer were decomposed by laser exposure for image recording since the temperature of the layer is elevated to about 500° C. Such decomposition does not take place with use of an image-forming layer incorporated with a highly heat-resistant pigment.

Incorporation of a low melting point material to the image-forming layer is preferred for the purposes of causing the image-forming layer to slightly flow to fill the gap between the scanning lines and improving the adhesion with the image-receiving layer. Also in order to enhance the adhesion between the image-receiving layer and the image-forming layer and secure a sufficient strength for the transferred image, similar binders are preferably used for the two layers.

The image-receiving sheet and the thermal transfer sheet are preferably held in a tight contact by vacuum on a drum. The tight contact by vacuum is significant since, in the present image-forming system based on the regulation of the adhesive force between the two sheets, the image-transfer behavior is very sensitive to the clearance between the image-receiving surface of the image-receiving sheet and the image-forming surface of the image-transfer sheet. The presence of foreign matters such as dust, which acts to expand the clearance between the sheets, results in the generation of image defects or uneven image transfer.

To prevent image defects or uneven image transfer due to such causes, the surface of the thermal transfer sheet should preferably be uniformly roughened whereby the air between the sheets can be sucked smoothly, thus achieving an even clearance.

Though the surface of the thermal transfer sheet can be roughened by a post treatment such as embossing, or by incorporating a matting agent into one of the coated layers, the latter process is preferred due to its simplicity of manufacturing operation and the stability of the resulting sheet product over a long period of usage. Preferable matting agents are coarser in size than the thickness of the coated layer. When the matting agent is incorporated in the image-forming layer, the areas occupied by the agent are converted to image deficiencies. Therefore, it is preferred to incorporate a matting agent having an optimal particle size into the light-to-heat conversion layer whereby the image-forming layer has a substantially uniform thickness capable of providing deficiency-free images on the image-receiving sheet.

For consistent reproduction of sharp dots with the sheet materials thus designed, the recording apparatus must be constructed according to a highly precise and advanced design, though the basic structure thereof is the same as the conventional thermal transfer image-recording apparatus. In the structure, a recording head equipped with high power multiple lasers emits light for recording on the laminate of the thermal transfer sheet and the image-receiving sheet that are firmly fixed on a drum. Such structure is usually called an outer drum-type heat mode laser recording system. In the following, a preferable embodiment is described.

The image-receiving sheet and the thermal transfer sheet in the form of rolls are fed fully automatically. The two sheets are fixed onto the recording drum by vacuum suction. The recording drum has a number of vacuum suction holes, through which the pressure of the inner space of the drum is reduced by means of a blower or a decompression pump, and the sheets are adsorbed onto the drum. For the thermal transfer sheet placed on the adsorbed image-receiving sheet to be also firmly adsorbed, the size of the thermal transfer sheet is made larger than that of the image-receiving sheet. The air remaining between the two sheets that exerts the most significant effect on the recording characteristics is sucked via the area covered only by the thermal transfer sheet extending outside the image-receiving sheet.

The apparatus is constructed so as to be able to accumulate plural sheets as large as B2 size on the exhaust tray. To realize a desirable stacking condition, an air stream is ejected between an already stacked sheet and an incoming sheet to help the floating of the latter.

A structural example of the present recording apparatus is illustrated in FIG. 2.

The operational sequence corresponding to the descriptions above is explained in detail.

1) The sub-scanning shaft of recording head 2 of recording apparatus 1 returns to the initial position by means of sub-scanning rail 3. Also, the main scanning rotary shaft of recording drum 4 as well as thermal transfer sheet-loading unit 5 returns to the initial position.

2) Image-receiving sheet roll 6 is unwound by transport rollers 7 and conveyed around recording drum 4 and the leading edge of the sheet is fixed on the drum by vacuum suction through the holes provided in the recording drum.

3) Squeeze roller 8 comes down onto recording drum 4 to press the image-receiving sheet advancing with the rotation of the drum. When the image-receiving sheet stops after conveyed by a pre-determined distance, cutter 9 cuts the sheet so as to have a pre-determined length.

4) Recording drum 4 makes another rotation to complete the loading of the image-receiving sheet.

5) Following a similar sequence as that for the image-receiving sheet, thermal transfer sheet K for the first color (black) is unwound from thermal transfer sheet roll 10K, cut and loaded.

6) Then, recording drum 4 enters into fast rotation, and recording head 2 on sub-scanning rail 3 moves to the record-starting position when recording head 2 emits a laser light for recording toward recording drum 4 according to the image signals to be recorded. When the recording head comes to the record-termination position, laser emission terminates, the operation of the sub-scanning rail and the drum rotation also stop. The recording head is then returned back to the initial position.

7) With the image-receiving sheet retained on the recording drum, only thermal transfer sheet K is peeled off. For that operation, the leading edge of thermal transfer sheet K is picked up by a finger, pulled toward the exhaust direction, and discarded into waste box 35 through discarding slit 32.

8) Steps 5) to 7) are repeated for the remaining three colors. The order of recording after black is cyan, magenta and yellow. Thus, thermal transfer sheet C for the second color (cyan), thermal transfer sheet M for the third color (magenta) and thermal transfer sheet Y for the fourth color (yellow) are unwound from corresponding thermal transfer sheet rolls 10C, 10M and 10Y, respectively. The order is reversed to that of the ordinary press operation since the arrangement of colorants on an actual printing stock is finally reversed by image transfer.

9) After the completion of four-color recording, the image-receiving sheet bearing recorded images is conveyed to exhaust tray 1. The sheet is separated off from the drum in the same way as described in 7) for the thermal transfer sheet. However, not to let the image-receiving sheet discarded, the sheet is switched back at the discard slit 32 to return to the exhaust tray. When the sheet is exhausted onto the tray, air stream 34 is ejected from the lower side of exhaust slit 33 thus enabling stacking of plural sheets.

It is preferred to adopt an adhesive roll as transport roller 7 arranged at the feeding position or along the transport path for the thermal transfer and image-receiving sheet rolls. The surface of the adhesive roll is provided with an adhesive material.

By providing an adhesive roll, the surfaces of the thermal transfer and image-receiving sheets can be cleaned.

Adhesive materials provided on the surface of the adhesive roll include ethylene-vinyl acetate copolymers, ethylene-ethyl acrylate copolymers, polyolefin resins, polybutadiene resins, styrene-butadiene copolymers (SBR), styrene-ethylene-butene-styrene copolymers (SEBS), acrylonitrile-butadiene copolymers (NBR), polyisoprene resins (IR), styrene-isoprene copolymers (SIS), acrylic acid ester copolymers, polyester resins, polyurethane resins, acrylic resins, butyl rubber and polynorbornenes.

When the adhesive roll contacts with the surface of the thermal transfer sheet or the image-receiving sheet, it can clean the surface whereby there is no special limitation for the contact pressure provided that the roll is in contact with the surface.

The Vickers Hardness Hv of the adhesive material used for the adhesive roll preferably does not exceed 50 kg/mm$^2$ ($\approx$490 Mpa) from the viewpoints of perfect removal of dust as a foreign matter and prevention of image defects.

Vickers hardness is obtained by pressing a sample with a diamond pushing head shaped in a right pyramid with a counter plane angle of 136 degrees and applied with a static load. Vickers hardness Hv is defined by the following formula.

$$\text{Hardness Hv}=1.854\ P/d^2\ (Kg/mm^2)\cong 18.1692\ \text{Mpa}$$

("$\cong$" menas "about")

In the formula, P is the load in Kg and d is the length of the diagonal of the square dent formed by pressing the head in mm.

In the invention, the adhesive material used for the adhesive roll preferably has an elastic modulus not exceeding 200 kg/cm$^2$ ($\cong$19.6 MPa). With adhesive materials satisfying these two conditions on the physical property thereof, dusts and other foreign matters can be efficiently eliminated to secure a desirable image quality free of defect.

The difference of the surface roughness Rz between the image-forming layer and the rear surface of the thermal transfer sheet preferably should not exceed 3.0 μm in absolute value, and the difference of the surface roughness Rz between the image-receiving layer and the rear surface of the image-receiving sheet preferably should not exceed 3.0 μm in absolute value, too. With such a construction, the generation of image defect can be prevented with the help of the cleaning means. The sheets are also prevented from jamming during conveyance, and moreover dot gain characteristics are stabilized.

More preferably, the difference of the surface roughness Rz's between the image-forming layer and the rear side of the thermal transfer sheet preferably should not exceed 1.0 μm in absolute value, and the difference of the surface roughness Rz's between the image-receiving layer and the rear side of the image-receiving sheet preferably also should not exceed 1.0 μm in absolute value for enhancing the advantageous features cited above.

As another embodiment, the surface roughness Rz for the image-forming layer and the rear side of the thermal transfer sheet and/or that for the front and rear surfaces of the image-receiving sheet are preferably adjusted to 2 to 30 μm. However, when the dynamic frictional force of the front and rear surfaces of the image-receiving sheet is less than 40 gf, the surface roughness Rz of the image-receiving side surface should not exceed 4 μm and the surface roughness Rz of the back surface should be not larger than 8 μm.

With such a construction, the generation of image defect can be prevented with the help of the cleaning means. The sheets are also prevented from jamming during conveyance, and moreover dot gain characteristics are stabilized.

The image-forming layer of the thermal transfer sheet preferably has a glossiness of from 80 to 99.

Glossiness is strongly dependent on the surface smoothness of the image-forming layer, and related to the uniformity of the image-forming layer thickness. High-gloss image-forming layers are suited for applications demanding high-resolution and high quality images due to their excellent uniformity. However, since a highly smooth sheet generally exhibits a higher conveyance resistance, glossiness and conveyance resistance tend to conflict with each other. When the glossiness lies in the range of 80 to 99, the two features are well balanced from a practical point of view.

Now, the mechanism of multi-color image formation based on thin film thermal transfer with use of laser is described with reference to FIG. 1.

Image-forming laminate 30 is prepared by superimposing image-receiving sheet 20 on image-forming layer 16 containing a black (I), cyan (C), magenta (M) or yellow (Y) pigment of thermal transfer sheet 10. Thermal transfer sheet 10 comprises substrate 12, light-to-heat conversion layer 14 provided on the substrate, and image-forming layer 16 that is provided on layer 14 while image-receiving sheet 20 comprises a substrate 22 and image-receiving layer 24 provided on the substrate. As is shown in FIG. 1-(a), image-receiving layer 24 is arranged in contact with the surface of image-forming layer 10 of thermal transfer sheet 10. From the side of substrate 12 of thermal transfer sheet 10 composing laminate 30, a laser light is sequentially irradiated imagewise to weaken the bonding force between light-to-heat conversion layer 14 and image-forming layer 16 of thermal transfer sheet 10 as a result of the heat generation in light-to-heat conversion layer 14 at the areas where the laser light was irradiated (FIG. 1-(b)). Thereafter, by peeling off image-receiving sheet 20 from thermal transfer sheet 10, laser-irradiated areas 16' in image-forming layer 16 are transferred onto image-receiving layer 24 of image-receiving sheet 20 (FIG. 1-(c)).

In the formation of multi-color images, the laser light used for image recording preferably consists of multi-beams, which especially preferably are arranged two-dimensionally. In the present purpose, such a two-dimensional multi-beam arrangement implies that the spots of laser multi-beams are arranged in a two-dimensional plane comprising plural rows along the main scanning direction and plural lines along the sub-scanning direction.

One can reduce the time required for laser recording with use of a laser light comprising two-dimensionally arranged multi-beams.

So long as comprising multi-beams, a laser light of any kind is applicable to the present purpose without special restriction, including those from gas lasers such as argon ion, helium-neon and helium-cadmium lasers, solid lasers such as YAG laser, and direct lasers such as semiconductor, dye and excimer lasers. The wavelength of such a laser light may be converted to half by means of a second harmonic wave converter. By taking into account the output power level and the ease of power modulation, semiconductor lasers are preferred. In image formation, the laser light is preferably irradiated in the form of a fine beam with a 5 to 50 $\mu$m (in particular, 6 to 30 $\mu$m) beam diameter on the light-to-heat conversion layer. The scanning rate is preferably set to 1 m/sec or higher (in particular, 3 m/sec or higher).

In the multi-color image formation, the thickness of the image-forming layer in the black thermal transfer sheet should preferably be larger than that in the yellow, magenta or cyan thermal transfer sheet, and specifically be 0.5 to 0.7 $\mu$m. With such a countermeasure, the black thermal transfer sheet never suffers from insufficient image density caused by uneven transfer during laser irradiation.

With a thickness of the image-forming layer of the black thermal transfer sheet less than 0.5 $\mu$m, an uneven image transfer sometimes takes place when a high-energy laser light is used for recording, failing in achieving an image density required for press proofs. Such undesirable results tend to frequently occur under highly humid conditions. This means that the image density depends sharply on the atmospheric condition. On the other hand, when the thickness exceeds 0.7 $\mu$m, a large laser irradiation energy is required to achieve image transfer, or in some cases small highlight dots are poorly reproduced or fine lines become thin. Such troubles become noticeable in operations under a low humidity condition. Other troubles include deterioration of image resolution. A more preferable range of the thickness of the image-forming layer in the black thermal transfer sheet is 0.55 to 0.65 mm, and a particularly preferable value is 0.60 $\mu$m.

Further, it is desirable that the thickness of the image-forming layer in the black thermal transfer sheet is 0.5 to 0.7 $\mu$m and that the thickness of the image-forming layer in the yellow, magenta or cyan thermal transfer sheet is 0.2 to 0.5 $\mu$m.

When each image-forming layer of the yellow, magenta and cyan thermal transfer sheets is thinner than 0.2 $\mu$m, an insufficient transferred image density results due to uneven transfer at laser recording, while, on the other hand, when the same layer has a thickness of 0.5 $\mu$m or larger, the image transfer sensitivity and/or image resolution deteriorate(s). A more preferable range of the thickness of the image-forming layer in the yellow, magenta or cyan thermal transfer sheet is 0.3 to 0.45 $\mu$m.

The image-forming layer of the black thermal transfer sheet preferably contains carbon black whereby it is preferred that the carbon black consists of two kinds differing in coloring power since the reflection density can be well controlled within a pre-determined range of the pigment-to-binder ratio.

The coloring power of carbon black can be expressed in a variety of ways including, for example, PVC blackness set forth in Japanese Patent Laid-Open No. 140033/1998. To measure PVC blackness, the carbon black in concern is incorporated and dispersed in a PVC resin with use of a two-roll kneader, and fabricated into a sheet, the blackness of which is visually judged with reference to 1 point for the blackness obtained with Carbon Black #40 and 10 points for that with Carbon Black #45, both made by Mitsubishi Chemical Corp. One can appropriately use two or more kinds of carbon black differing in PVC blackness depending on the application purpose.

In the following, actual procedures for sample preparation are described.

Procedures for Sample Preparation

A 250 cc Banbury mixer was charged with a low-density polyethylene (LDPE) and a sample carbon black in an amount of 40% by weight of the LDPE, and operated for 4 min at 115° C. Compounding condition

| | |
|---|---|
| LDPE resin | 101.89 g |
| Calcium stearate | 1.39 g |
| Irganox 1010 | 0.87 g |
| Sample carbon black | 69.43 g |

Then, the resulting mixture is diluted so as to give 1% by weight carbon black concentration by means of a two-roll mill at 120° C.

Diluted Compound Preparation Condition

| | |
|---|---|
| LDPE resin | 53.3 g |
| Calcium stearate | 0.2 g |

The mixture prepared above containing 40% by weight carbon black 1.5 g

The diluted compound is fabricated into a sheet with use of a 0.3 mm width slit. The sheet is cut into tips, and processed into the form of film with 65±3 μm thickness on a 240° C. hot plate.

As the process of forming a multi-color image, one may repetitively transfer plural image layers (the image-forming layers in which images are formed) on a single image-receiving sheet with use of the thermal transfer sheets described hereinabove, or first form images on the image-receiving layers of plural image-receiving sheets, and then retransfer those images onto a sheet of an actual printing stock.

In the latter process, for example, four kinds of image-forming laminates each comprising a thermal transfer sheet having an image-forming layer containing a colorant of a different hue such as cyan, magenta, yellow and black, and an image-receiving sheet are prepared. Each laminate is subjected to a laser exposure based on the digital signal associated with the image to be recorded (through a color separation filter). Then, the thermal transfer sheet and the image-receiving sheet are separated, thus forming a color separation image independently on one image-receiving sheet. Then, each color separation image is transferred and superimposed onto an actual substrate such as a printing stock or one simulating the printing stock. In this way, a multi-color image results.

Any type of thermal transfer recording based on laser a exposure is within the scope of the invention so long as the energy of the laser beams is converted into heat, and acts to transfer a pigment-containing image-forming layer to an image-receiving sheet to give an image there whereby the state of the pigment, dye or image-forming layer during transfer is not specially restricted including a solid, softened solid, liquid or gaseous state. Among these states, solid and softened solid states are preferred. Conventionally known thermal transfer recording processes such as melt transfer, abrasion transfer and sublimation transfer are also included.

In particular, the thin film transfer and melt to abrasion transfer processes described hereinabove are preferred due to their capability of forming images having colors closely resembling those of the conventional printed matters.

A heat laminator is usually used for the transfer of the image-receiving sheet bearing images obtained with the recording apparatus of the invention onto an actual printing stock (which will be called printing stock hereinafter). When the image-receiving sheet is superimposed on an actual press paper under the application of heat and pressure, the two sheets are bonded together. Thereafter, by peeling off the image-receiving sheet from the printing stock, only the image-receiving layer carrying the image remains on the printing stock.

By connecting the apparatus and units described heretofore to a plate-making system, an integral system provided with a function of color proofer completes. As such a system, the recording apparatus must be able to output prints with an appearance as close as possible to that of printed matters prepared by plate-making data. Accordingly, software is required to make the colors and dot structure of the proof similar to those of the corresponding printed matter. Practical system connections are shown below.

In the case of making proofs of the printed matter produced by a plate-making system (exemplified by Celebra of Fuji Photo Film Co., Ltd.), sub-systems are connected together as follows. A CTP (Computer-to-Plate) system is connected to the plate-making system. Printing plates made by this combination are loaded in a press machine to give final printed matters. The recording apparatus described hereinabove is connected as a color proofer to the plate-making system whereby a PD system (a registered trademark), a proof drive software, is connected therebetween to match the colors and dot structure of the proof to those of the printed matter.

The plate-making system converts contone (continous tone) image data to raster data, which is further converted to binary data for halftone dot image, outputted to the CTP system, and finally printed. On the other hand, the same contone data is transmitted to the PD system, too, which converts the transmitted data so as to match colors to those of the printed matter with use of a four-dimensional (black, cyan, magenta and yellow) table. Then, the converted data is further converted to binary data representing halftone dots that match those of the printed matter, and transmitted to the recording apparatus.

The four-dimensional table, which has been prepared experimentally in advance, is stored in the system. The following experiment is conducted for the production of such table. The color data of significant colors is printed via the CTP system and also outputted via the PD system with use of the recording apparatus. The prints are compared colorimetrically, and a table is formed so as to minimize the difference in the colorimetric values.

The image-forming material containing the thermal transfer sheet of the invention preferably used in the recording apparatus of the integral system cited above will be described below more in detail.

Thermal Transfer Sheet

The thermal transfer sheet comprises a substrate, and at least one image-forming layer provided thereon, and preferably a light-to-heat conversion layer and still other layers according to need.

Substrate

There is no special restriction on the material used for the substrate of the thermal transfer sheet, thus a variety of substrate materials can be used according to need. Preferable substrates are provided with a certain level of stiffness, a good dimensional stability and a resistance to the heat generated in image formation. Preferable examples of the substrate material include synthetic polymer materials such as poly(ethylene terephthalate), poly(ethylene 2,6-naphthalate), polycarbonate, poly(methyl methacrylate), polyethylene, polypropylene, poly(vinyl chloride), poly(vinylidene chloride), polystyrene, styrene-acrylonitrile copolymer, (aromatic and aliphatic) polyamide, polyimide, polyamide-imide and polysulfone. Among them biaxially elongated poly(ethylene terephthalate) is preferred in consideration of mechanical strength and the dimensional stability under elevated temperatures. When the sheet is used for the preparation of color proofs by laser recording, the substrate of the thermal transfer sheet is preferably made of a synthetic resinous material transparent to the laser light used. The thickness of the substrate is preferably 25 to 130 μm, more preferably 50 to 120 μm. The centerline average surface roughness Ra of the substrate surface in the image-forming layer side, which is measured with a surface roughness meter exemplified by Surfcom of Tokyo Seimitsu Co., Ltd., should preferably not exceed 0.1 μm. The Young's modulus of the substrate along the machine direction is preferably 200 to 1,200 Kg/mm$^2$ ($\cong$2 to 12 GPa), while that along the cross-machine direction is preferably 250 to 1,600 Kg/mm$^2$ ($\cong$2.5 to 16 GPa) The F-5 value of the substrate in the machine direction is preferably 5 to 50 Kg/mm$^2$ ($\cong$49 to 490 MPa), and that in the cross-machine direction preferably 3 to 30 Kg/mm$^2$ ($\cong$29.4 to 294 MPa). Generally, the F-5 value for the machine direction is larger than that for the cross-machine direction. However, in cases where the substrate strength in the cross-machine direction must be enhanced, this condition needs not be maintained. The thermal contraction rate of the substrate in the machine and cross-machine direction for heating at 100° C. for 30 min does not preferably exceed 3%, more preferably 1.5%, and that for heating at 80° C. for 30 min does not preferably exceed 1%, more preferably 0.5%. The fracture strength is preferably 5 to 100 Kg/mm$^2$ ($\cong$49 to 980 MPa) in both directions, and the elastic modulus is preferably 100 to 2000 Kg/mm$^2$ ($\cong$0.98 to 19.6 GPa).

The substrate of the thermal transfer sheet may be subjected to a surface activation treatment or have single, double or more sub-coating layers for the purpose of improving the adhesion of the light-to-heat conversion layer provided thereon. Examples of the surface activation treatment include glow and corona discharge treatments. The material of the sub-coating preferably includes those exhibiting a strong adhesion to the both surfaces of the substrate and the light-to-heat conversion layer, having a low heat conductivity and a superior heat-resistance. Such materials for the sub-coating include styrene copolymers, styrene-butadiene copolymers and gelatin. The thickness of the sum of the sub-coatings usually lies in the range of 0.01 to 2 $\mu$m. The surface of the thermal transfer sheet opposite to the surface coated with the light-to-heat conversion layer may be provided with a functional layer such as an anti-reflection layer and an anti-static layer, or subjected to a surface treatment imparting such functions, if required and necessary.

Back Coating

A back coating can be provided on the surface opposite to the one provided with the image-forming layer.

Such a back coating preferably has a dual layer structure comprising a first coating contiguous to the substrate and a second back coating superposed on the first layer. The ratio B/A of the amount B of the anti-static agent included in the second back coating to the amount A of the anti-static agent included in the first back coating is preferably less than 0.3. When the value of B/A exceeds 0.3, the back coatings tend to suffer not only from a poor slipping property, but also a serious powder fall-off therefrom.

The layer thickness C of the first back coating is preferably 0.01 to 1 $\mu$m, more preferably 0.01 to 0.2 $\mu$m. The layer thickness D of the second back coating is preferably 0.01 to 1 $\mu$m, more preferably 0.01 to 0.2 $\mu$m. The ratio C/D of these layer thicknesses preferably lies in the range of 1:2 to 5:1.

The anti-static agent used in the first and second back coatings includes non-ionic surfactants such as poly (oxyethylene alkylamine) and the glycerin esters of fatty acids, cationic surfactants such as quaternary ammonium salts, anionic surfactants such as alkyl phosphates, ampho-teric surfactants and electro-conductive resins.

Electro-conductive fine particulate materials can be used as anti-static agents, too. Such particulate materials include, for example, oxides such as ZnO, $TiO_2$, $SnO_2$, $Al_2O_3$, $In_2O_3$, MgO, BaO, CoO, CuO, $Cu_2O$, CaO, SrO, $BaO_2$, PbO, $PbO_2$, $MnO_3$, $MoO_3$, $SiO_2$, $ZrO_2$, $Ag_2O$, $Y_2O_3$, $Bi_2O_3$, $Ti_2O_3$, $Sb_2O_3$, $Sb_2O_5$, $K_2Ti_6O_{13}$, $NaCaP_2O_{18}$ and $MgB_2O_5$; sulfides such as CuS and ZnS; carbides such as SiC, TiC, ZrC, VC, NbC, MoC and WC; nitrides such as $Si_3N_4$, TiN, ZrN, VN, NbN and $Cr_2N$; borides such as $TiB_2$, $ZrB_2$, $NbB_2$, $TaB_2$, CrB, MoB, WB and $LaB_5$; silicides such as $TiSi_2$, $ZrSi_2$, $NbSi_2$, $TaSi_2$, $CrSi_2$, $MoSi_2$ and $WSi_2$; metal salts such as $BaCO_3$, $CaCO_3$, $SrCO_3$, $BaSO_4$ and $CaSO_4$; and complex compounds such as $SiN_4$—SiC and $9Al_2O_3$—$B_2O_3$. Among these, $SnO_2$, ZnO, $Al_2O_3$, $TiO_2$, $In_2O_3$, MgO, BaO and $MoO_3$ are preferred. $SnO_2$, ZnO, $In_2O_3$, $TiO_2$ and $SnO_2$ are more preferred. The most preferable material is $SnO_2$.

When the thermal transfer sheet of the invention is used for laser thermal transfer recording, the antistatic agent incorporated in the back coating should preferably be substantially transparent for the laser light used for recording.

In the case where an electro-conductive metal oxide is used as the antistatic agent, its particle size should be made as small as possible to suppress light scattering. And optimal sizes, which should be determined based on the ratio of the refractive indices of the particle and the binder, can be deduced with the Mie's theory. The average particle size generally lies in 0.001 to 0.5 $\mu$m, and preferably 0.003 to 0.2 $\mu$m. The average particle size here implies not only that of the primary particle of the electro-conductive metal oxide but also those of higher order structures.

The first and second back coatings can contain, in addition to an antistatic agent, various additives such as a surfactant, a slipping agent, a matting agent, and a binder. The content of the antistatic agent in the first back coating is preferably 10 to 1,000 parts by weight, more preferably 200 to 800 parts by weight per 100 parts by weight of the binder. The corresponding content in the second back coating is preferably 0 to 300 parts by weight, more preferably 0 to 100 parts by weight per 100 parts by weight of the binder.

The binder used for the formation of the first or second back coating includes, for example, homo- and copolymers of acrylic acid-based monomers such as acrylic acid, meth-acrylic acid, acrylic acid esters and methacrylic acid esters, cellulose polymers such as nitrocellulose, methyl cellulose, ethyl cellulose and cellulose acetate, vinyl polymers and vinyl monomer-containing copolymers such as polyethylene, polypropylene, polystyrene, vinyl chloride copolymer, vinyl chloride-vinyl acetate copolymer, polyvinylpyrrolidone, poly(vinyl butyral) and poly(vinyl alcohol), condensed polymers such as polyester, polyurethane and polyamide, rubber-based thermoplastic polymers such as butadiene-styrene copolymer, those resulting from the polymerization or cross-linking of photo-polymerizable or thermally polymerizable compounds such as epoxy compounds, and melamine compounds.

Light-to-heat Conversion Layer

The light-to-heat conversion layer contains a light-to-heat conversion material and a binder; the layer may further contain a matting agent and other ingredients if required.

The light-to-heat conversion material has a function of converting the energy of the irradiated light into a thermal energy. Most often, dyes and pigments that absorb the laser light for recording are adopted. Preferable light-to-heat conversion materials, which depend on the wavelength of the laser light used, include black pigments such as carbon black, pigments that comprise a large cyclic group in the molecular structure having an absorption in the visible to near infrared regions including phthalocyanines and naphthalocyanines, organic dyes used as the laser light-absorbing material for high-density laser recording media such as optical discs (e.g., cyanine dyes such as indolenines, anthraquinone dyes, azulene dyes and phthalocyanine dyes), and organic metal compound dyes such as dithiol nickel complexes. Among these, carbon black is preferred due to its low cost and high absorption efficiency for laser lights. Also cyanine dyes are preferred, since, due to their high absorption coefficient for infrared light, the light-to-heat conversion layer can be made extremely thin, achieving an improved recording sensitivity.

In addition to dyes, particulate metallic or inorganic materials such as black silver can be used as the light-to-heat conversion material.

The binder for the light-to-heat conversion layer is preferably composed of a resin that is provided with at least an intensity enough to form a film on the substrate, and has a high heat conductivity. Resins which have such a heat resistance as not to be decomposed by the heat generated by the light-to-heat conversion material during image recording are preferred since the surface smoothness of the light-to-heat conversion layer is retained even after a laser exposure with high energy densities. Specifically, resins with a thermal decomposition temperature preferably not lower than 400° C., more preferably not lower than 500° C. are used. The thermal decomposition temperature is defined as the temperature at which the resin loses 5% by weight in an air stream when TGA (thermogravimetric analysis) is conducted at a temperature-elevating rate of 10° C./min. The binder preferably has a glass transition temperature between 200° C. and 400° C., and more preferably between 250° C. and 350° C. With binders having glass transition temperatures below 200° C., fogging takes place in recorded images while with those having glass transition temperatures above 400° C., the resins exhibit a poor solubility to cause the drop of production efficienty.

The binder of the light-to-heat conversion layer should preferably have a heat-resistance (specifically, in terms of thermal deformation temperature or thermal decomposition temperature) higher than the materials used in additional layers provided thereon.

Specific examples include acrylic acid-based resins such as poly(methyl methacrylate), vinyl polymers such as polystyrene, poly (vinyl butyral), poly (vinyl chloride), vinyl chloride/vinyl acetate copolymer and poly(vinyl alcohol), polycarbonate, polyester, polyamide, polyimide, polyetherimide, polysulfone, polyether-sulfone, aramide, polyurethane, epoxy resin and urea/melamine resin. In cases where carbon black is used as the light-to-heat conversion material, water-soluble resins such as poly (vinyl alcohol) are preferred. On the other hand, in cases where a dye is used, polyimide resins that are readily soluble in organic solvents are preferred.

In particular, the polyimide resins represented by the following general formulae (I) to (VII) enable an efficient production of the thermal transfer sheet owing to their good solubility in organic solvents. These resins are also suited since they improve the viscosity stability, the storage capability and the humidity resistance of the coating mixture for the light-to-heat conversion layer.

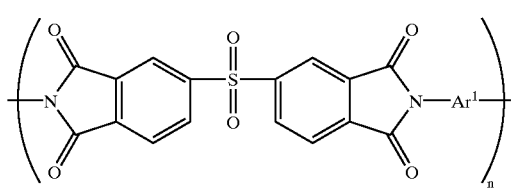

(I)

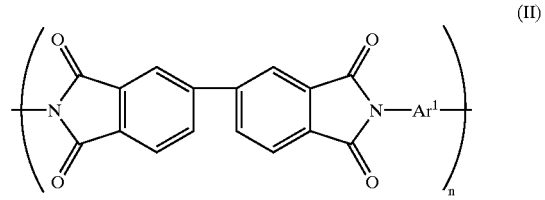

(II)

In the above general formulae (I) and (II), $Ar^1$ represents an aromatic group represented by the following structural formulae (1) to (3), and n represents an integer of from 10 to 100.

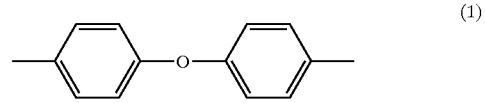

(1)

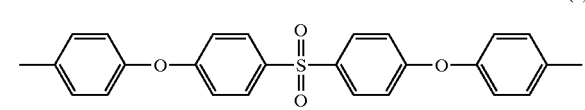

(2)

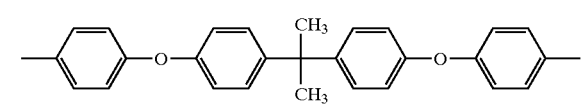

(3)

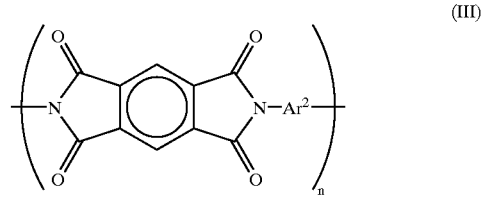

(III)

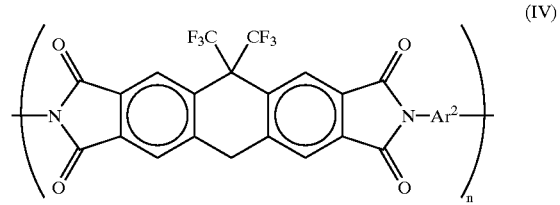

(IV)

In the above general formulae (III) and (IV), $Ar^2$ represents an aromatic group represented by the following structural formulae (4) to (7), and n represents an integer of from 10 to 100.

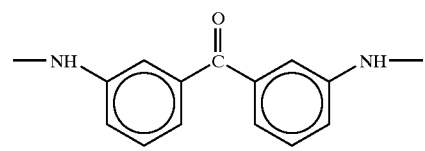

(4)

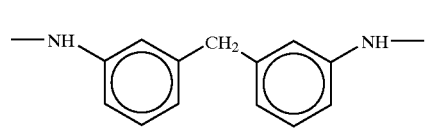

(5)

(6)
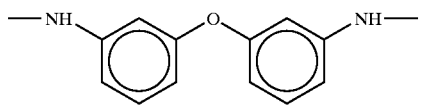

(7)
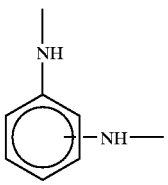

(V)
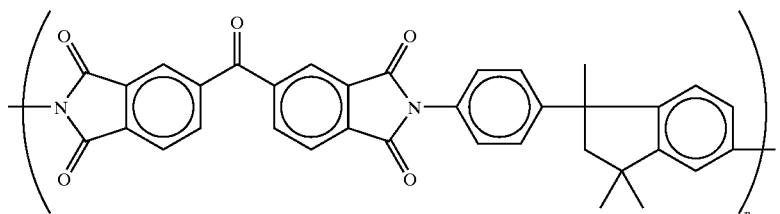

(VI)
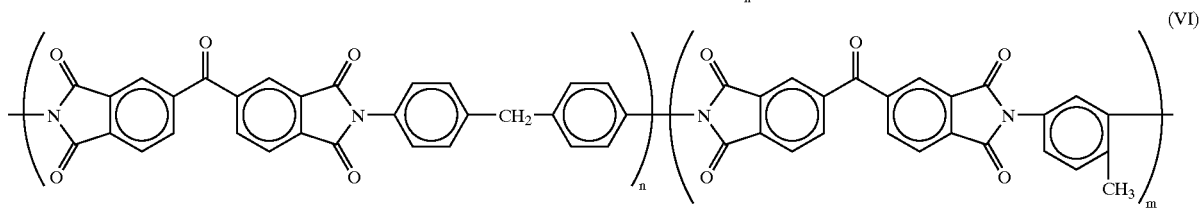

(VII)
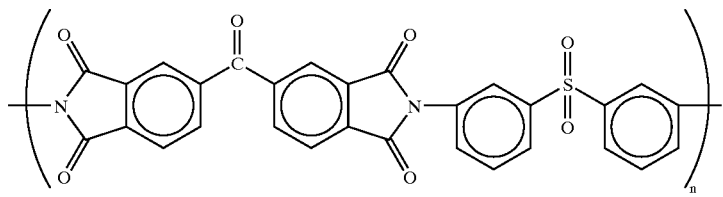

In the above general formulae (V) to (VII), n and m each represents an integer of from 10 to 100. In formula (VI), the ratio of n:m is from 6:4 to 9:1.

When a resin dissolves in 100 parts by weight of N-methylpyrrolidone by 10 parts by weight or more at 25° C., the resin is judged soluble therein. When the dissolving amount of a resin exceeds 10 parts by weight, it can be preferably used as the resin for the light-to-heat conversion layer. Resins soluble in 100 parts by weight of N-methylpyrrolidone by 100 parts by weight or more are more preferably used.

The matting agent incorporated in the light-to-heat conversion layer includes inorganic and organic fine particulate materials. Inorganic fine particulate materials include silica, titanium oxide, aluminum oxide, zinc oxide, magnesium oxide, barium sulfate, magnesium sulfate, aluminum hydroxide, magnesium hydroxide, boron nitride, kaolin, clay, talc, flowers of zinc, white lead, zeolite, quartz, diatomite, baryta, bentonite, mica and synthetic mica. organic particulate materials include particles of fluoro resins, guanamine resins, acrylic resins, styrene-acrylate copolymers, silcone resins, melamine resins and epoxy resins.

The particle size of the matting agent is usually 0.3 to 30 $\mu$m, preferably 0.5 to 20 $\mu$m. Its content is preferably 0.1 to 100 mg/m$^2$.

The light-to-heat conversion layer may further contain a surfactant, a thickener and an antistatic agent if required.

The light-to-heat conversion layer can be provided on the support as follows. First a coating mixture is prepared by dissolving a light-to-heat conversion material and a binder, and adding other ingredients depending on need. The coating mixture is coated on the substrate and dried. The solvent used to dissolve the binder includes, for example, water, propyl alcohol, ethanol, methanol, 1,4-dioxane, 1,3-dioxane, methyl acetate, N-methyl-2-pyrrolidone, methyl ethyl ketone and ethyl acetate. Any of ordinary coating and drying methods can be adopted. The drying is conducted usually at a temperature not exceeding 300° C., and more preferably not exceeding 200° C. When the substrate is made of poly(ethylene terephthalate), the drying is preferably conducted at a temperature between 80 and 150° C.

Too small an amount of the binder in the light-to-heat conversion layer results in a weak cohesive force of the layer. Hence, in the transfer operation of the image formed in the image-forming layer onto the image-receiving sheet, the light-to-heat conversion layer is liable to be transferred together with the image, thus causing undesirable color contamination. On the other hand, with too high a binder content, the thickness of the conversion layer becomes large to achieve a pre-determined light absorption, which sometimes results in sensitivity deterioration. The solid mass ratio of the light-to-heat conversion material to the binder in the conversion layer is preferably between 1:20 and 1:1, and more preferably between 1:10 and 1:2.

With a thin light-to-heat conversion layer, a high sensitivity of the thermal transfer sheet is achieved, as explained hereinabove. The light-to-heat conversion layer is preferably 0.03 to 1.0 $\mu$m thick, and more preferably 0.05 to 0.5 $\mu$m thick. The optical density of the light-to-heat conversion layer at the peak wavelength (e.g., 808 nm) of the laser light for recording should preferably lie in the range of from 0.80 to 1.26, more preferably 0.92 to 1.15 whereby a sufficiently high transfer sensitivity is secured for the image-forming layer. An optical density at the peak wavelength below 0.80 is not enough for securing a high transfer sensitivity since the irradiated light is not effectively converted to heat. On the other hand, with optical densities exceeding 1.26, the function of the conversion layer during recording is adversely affected, thus sometimes leading to fog generation. In the present specification, the optical density of the light-to-heat conversion layer in the thermal transfer sheet of the invention indicates the absorbance of the layer at the peak wavelength of the laser light used for recording, and can be measured with a spectrometer well known in the art. In the invention, UV-240, a UV spectrometer made by Shimadzu Corp. was used. Just to make sure, the optical density here means the value measured with the transfer sheet containing the substrate minus the density of the substrate itself.

Image-forming Layer

The image-forming layer contains at least a pigment that forms images transferred onto the image-receiving sheet, further a binder necessary for layer formation, and other additional ingredients according to need.

Pigments are classified into organic and inorganic ones. The former excels in the transparency of the coated film while the latter generally excels in covering power. Accordingly, the pigments belonging to the two groups may be appropriately selected depending on the applications in concern. In cases where the thermal transfer sheets are used for color proofs for graphic arts, organic pigments that match in color or have similar colors with the yellow, magenta, cyan or black pigments used in printing inks are preferably adopted. In some cases, metal powders or fluorescent pigments are used. Preferable examples of such organic pigments include azo, phthalocyanine, anthraquinone, dioxazine, quinacrydone, isoindolinone and nitro pigments. In the following, pigments applicable to the image-forming layer are enumerated for each color hue. But those pigments do not restrict the scope of the invention at all.

1) Yellow Pigment
Pigment Yellow 12 (C. I. No. 21090)
 Examples: Permanent Yellow DHG (Clariant Japan K. K.), Lionel Yellow 1212B (Toyo Ink Mfg Co., Ltd.), Irgalite Yellow LCT (Chiba Specialty Chemicals K. K.) and Symuler Fast Yellow GTF 219 (Dainippon Ink and Chemicals, Inc.).
Pigment Yellow 13 (C. I. No. 21100)
 Examples: Permanent Yellow GR (Clariant Japan K. K.) and Lionol Yellow 1313 (Toyo Ink Mfg Co., Ltd.).
Pigment Yellow 14 (C. I. No. 21095)
 Examples: Permanent Yellow G (Clariant Japan K. K.), Lionol Yellow 1401-G (Toyo Ink Mfg Co., Ltd.), Seika Fast Yellow 2270 (Dainichiseika Color & Chemicals Mfg. Co., Ltd.) and Symuler Fast yellow 4400 (Dainippon Ink and Chemicals, Inc.).
Pigment Yellow 17 (C. I. No. 21105)
 Examples: Permanent Yellow GG02 (Clariant Japan K. K.) and Symuler Fast yellow 8GF (Dainippon Ink and Chemicals, Inc.).
Pigment Yellow 155
 Examples: Graphtol Yellow 3GP (Clariant Japan K. K.).
Pigment Yellow 180 (C. I. No. 21290)
 Examples: Novoperm Yellow P-HG (Clariant Japan K. K.) and PV Fast Yellow HG (Clariant Japan K. K.).
Pigment Yellow 139 (C. I. No. 56298)
 Examples: Novoperm Yellow M2R 70 (Clariant Japan K. K.)

2) Magenta Pigment
Pigment Red 57:1 (C. I. No. 15850:1)
 Examples: Graphtol Rubine L6B (Clariant Japan K. K.), Lionol Red 6B-4290G (Toyo Ink Mfg. Co., Ltd.), Irgalite Rubine 4BL (Chiba Specialty Chemicals K. K.) and Symuler Brilliant Carmine 6B-229 (Dainippon Ink and Chemicals, Inc.).
Pigment Red 122 (C. I. No. 73915)
 Examples: Hosterperm Pink E (Clariant Japan K. K.), Lionogen Magenta 5790 (Toyo Ink Mfg. Co., Ltd.) and Fastogen Super Magenta RH (Dainippon Ink and Chemicals, Inc.).
Pigment Red 53:1 (C. I. No. 15585:1)
 Examples: Permanent Lake Red LCY (Clariant Japan K. K.) and Symuler Lake Red C Conc (Dainippon Ink and Chemicals, Inc.).
Pigment Red 48:1 (C. I. No. 15865:1)
 Examples: Lionol Red 2B 3300 (Toyo Ink Mfg. Co., Ltd.) and Symuler Red NRY (Dainippon Ink and Chemicals, Inc.).
Pigment Red 48:2 (C. I. No. 15865:2)
 Examples: Permanent Red W2T (Clariant Japan K. K.), Lionol Red LX235 (Toyo Ink Mfg. Co., Ltd.) and Symuler Red 3012 (Dainippon Ink and Chemicals, Inc.).
Pigment Red 48:3 (C. I. No. 15865:3)
 Examples: Permanent Red 3RL (Clariant Japan K. K.) and Symuler Red 2BS (Dainippon Ink and Chemicals, Inc.).
Pigment Red 177 (C. I. No.65300)
 Examples: Cromophtal Red A2B (Chiba Specialty Chemicals K. K.).

3) Cyan Pigment
Pigment Blue 15 (C. I. No.74160)
 Examples: Lionol Blue 7027 (Toyo Ink Mfg. Co., Ltd.) and Fastogen Blue BB (Dainippon Ink and Chemicals, Inc.).
Pigment Blue 15:1 (C. I. No.74160)
 Examples: Hosterperm Blue A2R (Clariant Japan K. K.) and Fastogen Blue 5050 (Dainippon Ink and Chemicals, Inc.).
Pigment Blue 15:2 (C. I. No.74160)
 Examples: Hosterperm Blue AFL (Clariant Japan K. K.), Irgalite Blue BSP (Chiba Specialty Chemicals K. K.) and Fastogen Blue GP (Dainippon Ink and Chemicals, Inc.).
Pigment Blue 15:3 (C. I. No.74160)
 Examples: Hosterperm Blue B2G (Clariant Japan K. K.), Lionol Blue FG7330 (Toyo Ink Mfg. Co., Ltd.), Cromophtal Blue 4GNP (Chiba Specialty Chemicals K. K.) and Fastogen Blue FGF (Dainippon Ink and Chemicals, Inc.).
Pigment Blue 15:4 (C. I. No.74160) p Examples: Hosterperm Blue BFL (Clariant Japan K. K.), Cyanine Blue 700-10FG (Toyo Ink Mfg. Co., Ltd.), Irgalite Blue GLNF (Chiba Specialty Chemicals K. K.) and Fastogen Blue FGS (Dainippon Ink and Chemicals, Inc.).
Pigment Blue 15:6 (C. I. No.74160)
 Examples: Lionol Blue ES (Toyo Ink Mfg. Co., Ltd.).
Pigment Blue 60 (C. I. No.69800)
 Examples: Hosterperm Blue RL01 (Clariant Japan K. K.) and Lionogen Blue 6501 (Toyo Ink Mfg. Co., Ltd.).

4) Black Pigment
Pigment Black 7 (Carbon Black C. I. No. 77266)
 Examples: Mitsubishi Carbon Black MA100 (Mitsubishi Chemical Corp.), Mitsubishi Carbon Black #5 (Mitsubishi Chemical Corp.) and Black Pearls 430 (Cabot Co.).

The pigments applicable to the invention can be appropriately selected from commercial products with reference to *Ganryo Binran* (Pigment Handbook) edited by Nihon Ganryo Gijyutu Kyokai (Pigment Technology Association of Japan), published by Seibundo Shinkosha Co., Ltd. (1989) and Colour Index, 3rd Edition published by the Society of Dyers & Colourist (1987).

Non-crystalline organic polymer materials with a softening point of 40 to 150° C. are preferably used for the binder of the image-forming layer. Such non-crystalline onganic polymeric materials include, for example, butyral resins, polyamide resins, polyethyleneimine resins, sulfonamide resins, polyester-polyol resins, petroleum resins, homopolymers and copolymers containing styrene and styrene derivatives such as vinyltoluene, α-methylstyrene, 2-methylstyrene, chlorostyrene, vinylbenzoic acid, sodium vinylbenzenesulfonate and aminostyrene, homopolymers and copolymers containing methacrylic acid-related monomers such as methyl methacrylate, ethyl methacrylate, butyl methacrylate and hydroxyethyl methacrylate and methacrylic acid, acrylic acid-related monomers such as methyl acrylate, ethyl acrylate, butyl acrylate, α-ethylhexyl acrylate and acrylic acid, dienes such as butadiene and isoprene, vinyl monomers such as acrylonitrile, vinyl ethers, maleic acid, maleic acid esters, maleic anhydride, cinnamic acid, vinyl chloride and vinyl acetate. These polymer materials may be used in mixtures of two or more thereof.

The image-forming layer can contain, in addition to the slipping agent and the ingredients cited above, the additional ingredients enumerated in the following items (1) and (2).

1. Plasticizer

Ester-type plasticizers are preferred including those well known in the art, i.e., phthalates such as dibutyl phthalate, di-n-octyl phthalate, di(2-ethylhexyl) phthalate, dinonyl phthalate, dilauryl phthalate, butyl lauryl phthalate and butyl benzyl phthalate; aliphatic dibasic acid esters such as di(2-ethylhexyl) adipate and di(2-ethylhexyl) sebacate; phosphoric acid triesters such as tricresyl phosphate and tri(2-ethylhexyl) phosphate; polyol polyesters such as poly (ethylene glycol) esters; and epoxy compounds such as epoxy aliphatic acid esters. Among various plasticizers including those cited above, the esters of vinyl monomers, in particular, the esters of acrylic or methacrylic acid are preferred since they can markedly improve the transfer sensitivity and image transfer uniformity, and widely control fracture elongation.

Preferable esters of acrylic or methacrylic acid include poly(ethylene glycol) dimethacrylate, 1,2,4-butanetriol trimethacrylate, trimethylolethane triacrylate, pentaerythritol acrylate, pentaerythritol tetraacrylate and dipentaerythritol polyacrylate.

The plasticizer may be a polymerized material. In particular, polyesters are preferred due to their high plasticizing efficiency and migration resistance over a long period of storage. Preferable polymer plasticizers include sebacic acid-based and adipic acid-based polyesters.

The additives incorporated in the image-forming layer are not restricted to those cited heretofore. Furthermore, the plasticizers may be used individually or in combination of two or more thereof.

Too large contents of the additives in the image-forming layer sometimes deteriorate the resolution of the transferred images, deteriorate the layer strength of the image-forming layer it self, or cause the image-forming layer at non-irradiated areas to be transferred onto the image-receiving sheet due to a weakened adhesion of the image-forming layer to the light-to-heat conversion layer. Thus, the content of the waxes cited previously should be preferably in the range of 0.1 to 30% by weight, more preferably 1 to 20% by weight of the total solid weight in the image-forming layer. The content of the plasticizer should preferably be in the range of 0.1 to 20% by weight, more preferably 0.1 to 10% by weight of the total solid weight in the image-forming layer.

2. Other Additives

The image-forming layer may further contain, in addition to the ingredients described heretofore, a surfactant, an inorganic or organic fine particulate material (a metal powder or silica gel), an oil (linseed oil and mineral oil), a thickener and an antistatic agent. By incorporating a material that absorbs the light from the light source used in recording, the amount of energy required for image transfer can be reduced except in the case of black image formation. Such materials having an absorption at the wavelength of the light from the source may be pigments or dyes. But, in the case of color image formation, it is desirable for color reproduction to adopt an infrared light source such as a semiconductor laser for image recording, and incorporate a dye that has an intense absorption at the wavelength of the recording light but exhibits substantially no absorption in the visible region. Examples of near IR-absorbing dyes include those set forth in Japanese Patent Laid-Open No. 103476/1991.

The image-forming layer on the light-to-heat-conversion layer can be provided by coating a coating mixture prepared by dissolving and/or dispersing a pigment and a binder on the conversion layer (when a heat-sensitive releasing layer is provided on the conversion layer, on that layer), and drying the mixture. Solvents used for the preparation of the coating mixture include n-propyl alcohol, methyl ethyl ketone, propylene glycol monomethyl ether (MFG), methanol and water. In carrying out the coating and drying, any known method may be adopted.

On the light-to-heat conversion layer of the thermal transfer sheet, a heat-sensitive releasing layer may be provided. The heat-sensitive releasing layer contains a heat-sensitive material that acts to weaken the bonding strength between the conversion layer and the image-forming layer by generating a gas or liberating adsorbed water by the action of the heat generated in the conversion layer. Such heat-sensitive materials include a compound (polymerized or of a low molecular weight) that is decomposed or denatured by heat to generate a gas, or one (polymerized or of a low molecular weight) that holds a considerable adsorbed or absorbed amount of readily volatile gaseous material such as moisture. These two kinds of compounds may be jointly used.

Polymeric compounds that are decomposed or denatured by heat to generate a gas include self-oxidizable polymers such as nitrocellulose, halogen-containing polymers such as chlorinated polyolefin, chlorinated rubber, poly(vinyl chloride) and poly (vinylidene chloride), acrylic polymers such as poly(isobutyl methacrylate) adsorbing a volatile compound such as water, cellulose esters such as ethyl cellulose adsorbing a volatile compound such as water and polymers of natural origin such as gelatin adsorbing a volatile compound such as water. Examples of the low molecular weight compound generating a gaseous material by the decomposition or denaturation caused by heat include diazo and azide compounds. These compounds decompose exothemically and generate gaseous compounds.

The decomposition or denaturation of such heat-sensitive materials promoted by heat preferably proceeds at temperatures not exceeding 280° C., more preferably not exceeding 230° C.

In cases where a low molecular weight compound is used as the heat-sensitive material for the heat-sensitive releasing layer, a binder is preferably jointly used with the compound. As such a binder, a heat-sensitive polymer capable of generating a gas upon thermal decomposition or denaturation may be employed, but ordinary polymers not exhibiting such thermal response may be also employed. In cases where a heat-sensitive compound and a binder are jointly used, the mass ratio therebetween is prefearbly 0.02:1 to 3:1, more preferably 0.05:1 to 2:1. The heat-sensitive releasing layer preferably covers substantially the entire surface of the light-to-heat conversion layer, and the thickness is usually 0.03 to 1 μm, preferably 0.05 to 0.5 μm.

In the thermal transfer sheet comprising a substrate and provided thereon a light-to-heat conversion layer, a heat-sensitive releasing layer and an image-forming layer in this order, the heat-sensitive releasing layer undergoes decomposition or denaturation by the heat conducted from the conversion layer to generate a gas. By the decomposition or the gas generation, part of the heat-sensitive releasing layer disappears, or a cohesive destruction occurs in the releasing layer, thus weakening the bonding between the conversion layer and the image-forming layer. Therefore, in some cases, part of the releasing layer may adversely adhere to the image-forming layer, and appear on the surface of the finally obtained image, acting as a cause of color contamination in the image. In taking into account such possibility, the heat-sensitive releasing layer should preferably be substantially colorless, i.e., transparent to the visible light to prevent visually recognizable color contamination in the final image. Specifically, the light absorption of the heat-sensitive releasing layer should not exceed 50% or preferably 10% for the visible light.

Instead of providing an independent heat-sensitive releasing layer in the thermal transfer sheet, a layer acting as both of the conversion layer and the releasing layer may be provided by using a coating mixture for the light-to-heat conversion layer containing a heat-sensitive material cited hereinabove.

The static frictional coefficient of the outermost layer of the thermal transfer sheet at the side where the image-forming layer is provided is preferably adjusted to 0.35 or lower, more preferably 0.20 or lower. By making the static frictional coefficient of the outermost layer not larger than 0.35, the thermal transfer sheet is not contaminated during conveyance with rolls, thus securing high image quality. The static frictional coefficient can be measured by the method described in paragraph [0011] of Japanese Patent Application No. 2000-85759.

The Smooster value of the image-forming layer surface preferably lies in the range of 0.5 to 50 mm Hg (≅0.0665 to 6.65 kPa ("≅" means "about").) at 23° C., 55% RH, and Ra thereof in the range of 0.05 to 0.4 μm. With these surface properties, the number of the minute voids is favorably suppressed that are present in the contact plane between the image-forming and image-receiving layers and where the two layers cannot directly contact, since a preferable transfer condition is secured for achieving high quality images. The value of Ra is measured with a surface roughness meter (Surfcom, a product of Tokyo Seimitsu Co., Ltd.). As for electrostatic property, the image-forming layer should preferably exhibit a potential of −100 to 100 V when the thermal transfer sheet is charged according to the US Federal Government Test Standard 4046, then grounded and left for 1 sec. The surface resistance of the image-forming layer should not exceed $10^9$ Ω at 23° C., 55% RH.

The image-receiving sheet used in combination with the thermal transfer sheet will be described.

Image-receiving Sheet

Layer Structure

The image-receiving sheet usually comprises a substrate and provided thereon one or more image-receiving layers, and if required, one or two layers selected from cushion and releasing layers and an inter-layer between the substrate and the image-receiving layer. The conveyance property is preferably improved by providing a back coating on the side of the substrate opposite to the image-receiving side.

Substrate

As the substrate, usual sheet-formed materials may be used including plastic, metal and glass sheets, resin-coated paper, paper and various composite materials. Suitable plastic sheets include those made of, for example, poly(ethylene terephthalate), polycarbonate, polyethylene, poly(vinyl chloride), poly(vinylidene chloride), polystyrene, styrene-acrylonitrile copolymer and polyester. Actual printing stocks and coated papers can also be used.

Substrates containing minute voids are preferred since image quality improves. Such substrates can be prepared by, for example, blending a thermoplastic resin with a filler such as an inorganic pigment or a polymer incompatible with the thermoplastic resin, fabricating the blended product into a mono- or multi-layer film with use of a melt extruder, and elongating the film uniaxially or biaxially. The content of void is determined by selecting the resinous materials and the filler, the blending ratio thereof and the elongation conditions.

As the thermoplastic resin, polyolefin resins such as polypropylene and poly(ethylene terephthalate) resins are preferred since they crystallize well, and are readily elongated and suited for void formation. It is preferred to use a polyolefin or poly(ethylene terephthalate) resin as the main ingredient and a small quantity of another thermoplastic resin together. Inorganic pigments used as the filler preferably include those with an average particle size of 1 to 20 μm comprising calcium carbonate, clay, diatomite, titanium oxide, aluminum hydroxide and silica. An example of the incompatible polymeric material used as the filler is poly(ethylene terephthalate) for polypropylene as the thermoplastic resin. Japanese Patent Application No. 290570/1999 describes in detail substrates containing minute voids.

The content of the filler such as inorganic pigments in the substrate is usually 2 to 30% by volume.

The substrate for the image-receiving sheet is usually 10 to 400 μm thick, and preferably 25 to 200 μm. The surface of the substrate may be subjected to a surface treatment using corona or glow discharge for the purpose of enhancing the adhesion with the image-receiving (or cushion) layer. The substrate of the thermal transfer sheet may also be treated similarly to enhance the adhesion with the image-forming layer.

Image-receiving Layer

On the surface of the image-receiving sheet, one or more image-receiving layers are preferably provided in order to transfer and fix the image-forming layer. The image-receiving layer preferably comprises mainly an organic polymer binder. Such binder is preferably thermoplastic, exemplified by homo- and copolymers of acrylic acid-based monomers such as acrylic acid, methacrylic acid, acrylic acid esters and methacrylic acid esters, cellulose polymers such as methyl cellulose, ethyl cellulose and cellulose acetate, vinyl polymers and vinyl monomer-containing copolymers such as polystyrene, polyvinylpyrrolidone, poly(vinyl butyral), poly(vinyl alcohol) and poly(vinyl chloride), condensed polymers such as polyester and polyamide, and rubber-based polymers such as butadiene-styrene copolymer.

Among these, polyvinyl butyral), the half ester of a styrene-maleic acid copolymer or a styrene-fumaric acid copolymer is particularly preferred as the polymer binder.

Although, two or more kinds of binder polymers may be used together, at least one compound selected from the half ester of a styrene-maleic acid copolymer and the half ester of a styrene-fumaric acid copolymer should occupy 10% to 40% by weight of the total binder.

From the viewpoint of achieving an appropriate adhesive strength with the image-forming layer, the binder of the image-receiving layer should comprise a polymer with a glass transition temperature (Tg) not exceeding 90° C. To meet this condition, a plasticizer may be added to the image-receiving layer. On the other hand, the binder polymer should preferably have a Tg not lower than 30° C. for preventing the sheet from blocking. The binder polymer of the image-receiving layer should preferably be the same as or similar to the binder polymer of the image-forming layer since not only the adhesion to the image-forming layer during laser recording improves, but also the sensitivity as well as the image strength are enhanced.

The Smooster value of the image-receiving layer surface preferably lies in the range of 0.5 to 50 mm Hg ($\cong$0.0665 to 6.65 kPa) at 23° C., 55% RH, and Ra thereof in the range of 0.05 to 0.4 $\mu$m. With these surface properties, the number of the minute voids is favorably suppressed that are present in the contact plane between the image-forming and image-receiving layers and where the two layers cannot directly contact, since a preferable transfer condition is secured for achieving high quality images. As for electrostatic property, the image-receiving layer should preferably exhibit a potential of −100 to 100 V when the image-receiving sheet is charged according to the US Federal Government Test Standard 4046, then grounded and left for 1 sec. The surface resistance of the image-forming layer should not exceed $10^9$ $\Omega$ at 23° C., 55% RH. Moreover, the static frictional coefficient of the image-receiving layer surface should preferably be not larger than 0.2, and the surface energy thereof should preferably be 23 to 35 mg/m$^2$.

In cases where the image once formed on the image-receiving layer is retransferred onto a printing stock, at least one image-receiving layer is preferably made of a photo-crosslinkable material. Exemplary compositions for such photo-crosslinkable materials comprise a) a photo-polymerizable monomer comprising one compound selected from a multi-functional vinyl or vinylidene compound that can form a photopolymer via addition polymerization; b) an organic polymer; c) a photo-polymerization initiator; and, if required and necessary, other additives such as thermal polymerization inhibitor. The multi-functional vinyl monomer includes unsaturated esters of polyols, and particularly the esters of acrylic or methacrylic acid such as, for example, ethylene glycol diacrylate and pentaerythritol tetracrylate are useful.

As the organic polymer, those enumerated as the binder used for image-receiving layer are included. The photo-polymerization initiator well known in the art such as benzophenone or Michler's ketone is used in an amount of 0.1 to 20% by weight of the layer.

The image-receiving layer is usually 0.3 to 7 $\mu$m thick, and preferably 0.7 to 4 $\mu$m. An image-receiving layer with a thickness below 0.3 $\mu$m tends to be broken due to a poor layer strength during the retransfer onto a printing stock. On the other hand, thicker layers than the cited range give too intense a glossiness to the retransferred print, failing in closely simulating actual printed matters.

Other Layers

A cushion layer may be provided between the substrate and the image-receiving layer. With the introduction of the cushion layer, one can secure a tight contact between the image-forming and image-receiving layers during laser thermal transfer, and also improve image quality. Further, even if foreign matters enter between the thermal transfer and image-receiving sheets, the gap therebetween is kept narrow due to the deformation of the cushion layer, leading to the reduction in size of the image defects such as white spots. Still further, in cases where the image once formed by thermal transfer is retransferred onto a printing stock, the image-receiving surface deforms in conformity with the surface roughness of the paper, thus improving the transfer behavior of the image-receiving layer. At the same time, since the gloss of the finally obtained print by retransfer can be lowered, the similarity to the actual printed matter improves.

The cushion layer, which has a structure readily deformable by the application of force to the image-receiving layer, preferably comprises a material with a low elastic modulus, one with a rubber-like elasticity, or a thermoplastic resin readily softened by heating. The modulus of elasticity of the cushion layer at room temperature is preferably 0.5 MPa to 1.0 GPa, more preferably 1 MPa to 0.5 GPa, and still more preferably 10 to 100 MPa. For foreign matters such as dust to be fully buried in, the degree of stylus penetration defined by JIS K2530 (at 25° C., with 100 g load for 5 sec) should be not lower than 10. The glass transition temperature of the cushion layer should not exceed 80° C., preferably 25° C. And the softening point is preferably 50 to 200° C. For the regulation of these physical properties, for example, Tg, a plasticizer may be added to the binder.

Specific examples used for the binder of the cushion layer include rubbers such as urethane, butadiene, nitrile, acrylic and natural rubbers, polyethylene, polypropylene, polyester, styrene-butadiene copolymer, ethylene-vinyl acetate copolymer, ethylene-acrylic derivative copolymer, vinyl chloride-vinyl acetate copolymer, vinylidene chloride resin, plasticized vinyl chloride resin, polyamide resin and phenol resin.

The thickness of the cushion layer, which varies depending on the type of resin used and other conditions, is usually 3 to 100 $\mu$m, preferably 10 to 52 $\mu$m.

The image-receiving layer must be bonded to the cushion layer until the laser recording completes, but to achieve a retransfer of images formed thereon onto a printing stock, the two layers are formed in a releasable manner. To facilitate the release, a release layer of 0.1 to 2 $\mu$m thickness may be preferably provided between the cushion layer and the image-receiving layer. With a large thickness of the release layer, the effect of the cushion layer tends to be masked. Thus, the layer thickness must be finely tuned in consideration of the type of the release layer.

The binder for the release layer includes polyolefins, polyesters, poly (vinyl acetal), poly(vinyl formal), parabanic acid, poly(methyl methacrylate), polycarbonate, ethyl cellulose, nitrocellulose, methyl cellulose, carboxymethyl cellulose, hydroxypropyl cellulose, poly(vinyl alcohol), poly(vinyl chloride), urethane resins, fluoro resins, polystyrene, styrene-based resins such as acrylonitrile-styrene copolymer, and crosslinked ones thereof, and thermally curable resins with Tg's not lower than 65° C. such as polyamide, polyimide, polyether imide, polysulfone, polyethter sulfone and aramide, and the crosslinked products of the crosslinkable resins among these. General-purpose crosslinking agents can be used for crosslinking, including those well known in the art such as isocyanates and melamine.

By taking into account the physical properties described hereinabove, the binder for the release layer is preferably made of a polycarbonate, acetal or ethyl cellulose to achieve a good storage stability. Further an excellent release property is obtained for the retransfer of the image formed by laser thermal transfer when the image-receiving layer comprises an acrylic resin.

Alternatively, a layer which drastically weakens the adhesion to the image-receiving layer when cooled can be used as the release layer. Specifically, such layers can be formulated with a heat-melting compound such as waxes and binders or a thermoplastic resin as the main ingredient.

Such heat-melting compounds include those set forth in Japanese Patent Laid-Open No. 193886/1988. Especially preferable materials include micro-crystalline wax, paraffin wax and carbauba wax. Useful thermoplastic resins include ethylene-containing copolymers such as ethylene-vinyl acetate copolymer and cellulose-based resins.

Such release layers may contain a higher fatty acid, a higher alcohol, a higher fatty acid ester, an amide and a higher amine if required and necessary.

Another category of the release layer consists of a layer that melts or softens with application of heat to cause a cohesive destruction itself, thus exhibiting a releasing effect. Such type of release layer preferably contains a super-cooling material.

Suitable super-cooling materials include poly-ϵ-caprolactone, polyoxyethylene, benzotriazole, tribenzylamine and vaniline.

Still another category of the release layer is based on a compound that weakens the adhesion to the image-receiving layer. Such compounds include silicone-based compounds such as silicone oils and polysiloxane resins; fluoro polymers such as Teflon and fluorine-containing acrylic resins; acetal resins such as poly(vinyl butyral), poly (vinyl acetal) and poly (vinyl formal); solid waxes such as polyethylene waxes and amide waxes; and surfactants such as fluorine-containing ones and phosphate ester-based ones.

The release layer can be provided by dissolving the above ingredients in a solvent or dispersing them in the form of latex, and coating the resulting mixture by means of blade coater, roll coater, bar coater, curtain coater or gravure coater, or spreading by means of hot melt extrusion lamination on the cushion layer. Alternatively, the coating mixture prepared in the same way as described above is coated by one of the methods cited above on a temporary support, then the coated product is bonded onto the cushion layer, and finally the temporary base is peeled off.

In the image-receiving sheet to be combined with the thermal transfer sheet, the image-receiving layer may be so constructed as to act also as a cushion layer. In such cases, the image-receiving sheet may comprise a substrate and a cushioning image-receiving layer, or a substrate, a subbing layer and a cushioning image-receiving layer. In these layer structures, the cushioning image-receiving layer is preferably provided releasable so as to enable the retransfer onto an actual printing stock whereby the print comprising the retransferred image on the printing stock exhibits a high gloss.

The thickness of the cushioning image-receiving layer is usually 5 to 100 $\mu$m, preferably 10 to 40 $\mu$m.

In the image-receiving sheet, a back coating can be preferably provided on the surface opposite to the one coated with the image-receiving layer since the conveyance property of the image-receiving sheet improves. By incorporating in the back coating an antistatic agent such as a surfactant or finely divided tin oxide and a matting agent such as silicon oxide and poly(methyl methacrylate) (PMMA) particles, the conveyance property of the sheet inside the recording apparatus improves.

These additives can be incorporated not only in the back coating but also in other layers including the image-receiving layer, if required and necessary. Though the type of the additives varies according to the purpose of addition, particles of 0.5 to 10 $\mu$m average size as a matting agent is added in an amount of 0.5 to 80% of the layer as an example. For static prevention, suitable materials selected from various surfactants and electro-conductive agents are appropriately used so that the surface resistance of the layer at 23° C., 50% RH does not exceed $10^{12}$ $\Omega$, more preferably $10^9$ $\Omega$.

Binder materials used for the back coating include various general-purpose polymers such as gelatin, poly (vinyl alcohol), methyl cellulose, nitrocellulose, acetyl cellulose, aromatic polyamide resins, silicone resins, epoxy resins, alkyl resins, phenol resins, melamine resins, fluro-resins, polyimide resins, urethane resins, acrylic resins, urethane-modified silicone resins, polyethylene resins, polypropylene resins, polyester resins, teflon resins, poly(vinyl butyral) resins, vinyl chloride resins, poly (vinyl acetate), polycarbonates, organic boron compounds, aromatic esters, fluorinated polyurethaness, and polyether sulfone.

Use of a crosslinkable water-soluble binder for the binder of the back coating in the crosslinked state is effective to prevent the fall-off of the matting agent and improve damage-resistance. Further, this countermeasure is effective for anti-blocking during the storage of the sheet material.

Any crosslinking process, which depends on the characteristics of the crosslinking agent used, may be adopted with use of heat, active light, pressure or combinations of these without special restriction. If required, an arbitrary adhesion coating may be provided on the substrate surface on which the back coating is formed for the purpose of imparting an adhesive property to the substrate.

The matting agent preferably incorporated in the back coating includes organic or inorganic particulate materials. Organic matting agents include particles of poly(methyl methacrylate) (PMMA), polystyrene, polyethylene, polypropylene and other polymers obtained by radical polymerization, and particles of condensed polymers such as polyester and polycarbonate.

The deposit amount of the back coating is preferably 0.5 to 5 $g/m^2$. With a deposit amount below 0.5 $g/m^2$, the coating performance becomes unstable, causing troubles including the fall-off of the matting agent. For deposit amounts exceeding 5 $g/m^2$, the particle size of suitable matting agents must be very large. Then, the back coating exerts an embossing effect onto the image-receiving layer surface, which yield a tendency of giving voids or white spots in the recorded image formed by thermally transferring the thin image-forming layer.

The matting agent preferably has a number-averaged particle size that is 2.5 to 20 $\mu$m larger than the thickness obtained only with the binder of the back coating. Among the particles of the matting agent, those not smaller than 8 $\mu$m in size are needed in an amount of 5 $mg/m^2$ or more, preferably 6 to 600 $mg/m^2$. Under these conditions, troubles particularly caused by foreign matters are improved. Furthermore, with use of a matting agent having a narrow size distribution in which the coefficient of variation obtained by dividing the standard deviation of particle size distribution by the number-averaged particle size ($\sigma$/rn) does not exceed 0.3, image defects which might be caused by extraordinarily large particles can be avoided, and at the same time a target performance can be achieved with a reduced amount of matting agent. The coefficient of variation should more preferably be 0.15 or less.

The back coating preferably contains an antistatic agent for the purpose of preventing the deposition of foreign matters due to the frictional charging against the transfer roll. As the antistatic agent, in addition to cationic, anionic, nonionic surfactants, polymerized antistatic compounds and electro-conductive finely divided materials, those described in 11290 no Kagaku Shohin (11290 Chemical Commercial Products) published by Kagaku Kogyo Nipposha (Chemical Industry Daily Report, Ltd.), pp. 875 to 876, can be used.

Among these antistatic agents, carbon black, a metal oxide such as zinc oxide, titanium oxide and tin oxide, and an electro-conductive particulate material such as an organic semiconductor are preferably used. In particular, use of electro-conductive fine particles is preferred since they will not migrate from the back coating, and exhibit a stable antistatic effect indifferent to the atmospheric condition.

The back coating may further be added with a releasing agent such as various surfactants, silicone oils or fluoro resins to improve coating performance and impart a releasable property.

The back coating particularly acts well for the cushion layer and the image-receiving layer both having a softening point not exceeding 70° C. measured by TMA (Thermomechanical Analysis).

A TMA softening point can be measured by observing the phase of a sample that is heated at a constant temperature-raising rate under the application of a constant load. In the specification, TMA softening point is defined as the temperature at which a phase change of the sample starts. The measurement of TMA softening points is conducted with a measuring apparatus such as Thermoflex made by Rigaku Corp.

The thermal transfer sheet and the image-receiving sheet are superimposed to form a laminate in such a manner that the image-forming layer of the former be in contact with the image-receiving layer of the latter to carry out image formation.

The laminate of the thermal transfer sheet and the image-receiving sheet can be prepared in a variety of ways. For example, such a laminate can be prepared by first bringing the image-forming layer of the thermal transfer sheet into contact with the image-receiving layer of the image-receiving sheet, and then passing the superimposed two sheets between a pair of pressing and heating rollers. The temperature of the rollers is preferably not higher than 160° C., more preferably not higher than 130° C.

Another preferable way of preparing a laminated body is based on vacuum contacting described here in above. In the vacuum contacting method, the image-receiving sheet is wound around a drum provided with holes for vacuum suction, then the thermal transfer sheet with a larger area than that of the image-receiving sheet is wound on the image-receiving sheet by means of a squeeze roller that evenly squeezes out the air between the sheets, thus achieving an intimate contact between the two sheets. Still another way is purely mechanical wherein the image-receiving sheet is attached onto a metal drum under a mechanically stretched condition, then the thermal transfer sheet is similarly attached on the image-receiving sheet along with the application of a stretching force. Among these methods, the vacuum contacting method is particularly preferred since it does not need the temperature control of the heat rollers, and is capable of achieving a uniform contact rapidly and reliably.

EXAMPLES

Some practical examples of the invention will be described hereinafter, but the scope of the invention is not restricted to the following examples at all. In the following description, "part" indicates "part by weight" if not otherwise noticed.

Example 1-1

Preparation of thermal transfer sheet
Preparation of Thermal Transfer Sheet Y
Preparation of the Coating Mixture for the First Back Coating Each ingredient in the following composition for the coating mixture was mixed under the agitation of a stirrer, and the resulting mixture was dispersed for 1 hour in a paint shaker (made by Toyo Seiki Co., Ltd.) to give the coating mixture for the first back coating.

| [Coating mixture composition] | |
|---|---|
| Aqueous dispersion of an acrylic resin (Solid content: 20% by weight, Julimer ET410 made by Nippon Pure Chemical Co., Ltd.) | 2.0 parts |
| Antistatic agent (an aqueous dispersion of tin oxide-antimony oxide) (average particle size: 0.1 μm, solid content: 17% by weight) | 7 parts |
| Polyoxyethylene phenyl ether | 0.1 parts |
| Melamine compound (Sumitix resin M-3 made by Sumitomo Chemical Co., Ltd.) | 0.3 parts |
| Distilled water to make | 100 parts |

On one surface of a poly(ethylene terephthalate) film substrate (Ra is equal to 0.01 μm for the both surfaces.) with 75 μm thickness and 65 cm width, the coating mixture for the first back coating was coated by means of wire bar, and the coated film was dried in an oven kept at 100° C. for 2 min to give the first back coating having a layer thickness of 0.04 μm on the substrate. The Young's modulus of the substrate in machine direction was 450 kg/mm$^2$ (≅4.4 GPa) while that in cross-machine direction was 500 kg/mm$^2$ (≅4.9 GPa). The F-5 value of the substrate in machine direction was 10 Kg/mm$^2$ (≅98 MPa) while that in cross-machine direction was 13 Kg/mm$^2$ (≅127.4 MPa). The thermal contraction ratio of the substrate for the heating at 100° C. for 30 min was 0.3% in machine direction, and 0.1% in cross-machine direction. The fracture strength was 20 Kg/mm$^2$ (≅196 MPa) in machine direction, and 25 Kg/mm$^2$ (≅245 MPa) in cross-machine direction. The elastic modulus was 400 Kg/mm$^2$ (≅3.9 GPa).

Preparation of the Coating Mixture for the Second Back Coating

Each ingredient in the following composition for the coating mixture was mixed under the agitation of a stirrer, and the resulting mixture was dispersed for 1 hour in a paint shaker (made by Toyo Seiki Co., Ltd.) to give the coating mixture for the second back coating.

| [Coating mixture composition] | |
|---|---|
| Polyolefin (solid content: 27% by weight, Chemipearl S-120 made by Mitsui Petrochemical Co., Ltd.) | 3.0 parts |
| Colloidal silica (Snowtex C made by Nissan Chemical Industries, Ltd.) | 2.0 parts |
| Epoxy compound (Dinakol EX-6145B made by Nagase Kasei, Ltd.) | 0.3 parts |
| Distilled water to make | 100 parts |

The coating mixture for the second back coating was coated by means of wire bar on the first back coating, and the coated film was dried in an oven kept at 100° C. for 2 min to give the second back coating having a layer thickness of 0.03 μm on the first back coating.

1) Preparation of the coating mixture for the light-to-heat conversion layer

Preparation of a Carbon Black Dispersion 15 parts of carbon black (Mitsubishi Carbon Black MA100 made by Mitsubishi Chemical Corp.), 82 parts of water and 3 parts of a surfactant (Sandet BL made by Sanyo Chemical Industries, Ltd.) were mixed and charged in a polyethylene vessel of 200 ml volume together with 50 parts of glass beads of 1 mm diameter. The vessel was loaded in a paint shaker (made by Toyo Seiki Co., Ltd.) and shaken for 5 hours to give a carbon black dispersion.

[Coating mixture for the light-to-heat conversion layer]

| | |
|---|---|
| Water | 85 parts |
| n-Propyl alcohol | 15 parts |
| Binder (poly (vinyl alcohol, PVA 205 made by Kuraray Corp.) | 3 parts |
| Surfactant (Sandet BL made by Sanyo Chemical Industries, Ltd.) | 0.1 parts |
| Finely divided silica (Seahoster KE-P150 made by Nippon Shokubai Co., Ltd.) | 0.07 parts |

All the ingredients above were dispersed with an ultrasonic dispersing apparatus for 30 min to give the coating mixture for the light-to-heat conversion layer.

2) Formation of the light-to-heat conversion layer on the substrate

On the surface opposite to the one provided with the back coating, the coating mixture for the light-to-heat conversion was coated by means of wire bar, and then dried in an oven kept at 120° C. for 3 min to give the light-to-heat conversion layer. The optical density of the resulting light-to-heat conversion layer at 808 nm was measured with a UV spectrometer UV-240 made by Shimadzu Corp. to give the value of 0.97. The thickness obtained by the observation of the cross-section of the conversion layer with a scanning electron microscope was 0.4 μm on average.

3) Preparation of the coating mixture for the yellow image-forming layer

All the ingredients in the following pigment primary dispersion composition were dispersed in a paint shaker (made by Toyo Seiki Co., Ltd.). Thereafter, the glass beads were removed to give a yellow pigment primary dispersion. The average particle size of the pigment measured with a dynamic light scattering measuring apparatus (N-4 made by Coulter Corp.) was 0.34 μm.

Composition of the Yellow Pigment Primary Dispersion
The following compound 12.9 parts

| | |
|---|---|
| Poly (vinyl butyral) (Eslec BBL-SH, a product of Sekisui Chemical Co., Ltd.) | 7.0 parts |
| Dispersing aid (Solsperse S-20000, a product of ICI Japan, Ltd.) | 0.8 parts |
| n-Propyl alcohol | 79.4 parts |
| Glass beads (3 mm φ) | 50 parts |

[Preparation of coating mixture 1 for the yellow image-forming layer]

| | |
|---|---|
| Poly (vinyl butyral) (Eslec BBL-SH, a product of Sekisui Chemical Co., Ltd.) | 0.3 parts |
| Rosin ester (KE-311, a product of Arakawa Chemical Industries, Ltd.) (Composition: 80 to 97% of resin acid. Composition of resin acid: abietic acid = 30 to 40%, neoabietic acid = 10 to 20%, dihydroabietic acid = 14% and tetrahydroabietic acid = 14%) | 0.2 parts |
| Behenic acid (NAA-222S, a product of NOF Corp.) | 0.2 parts |
| Surfactant (Megafac F-176PF, solid content: 20%, a product of Dainippon Ink and Chemicals, Inc.) | 0.1 parts |
| Methyl ethyl ketone | 18 parts |
| n-Propyl alcohol | 70 parts |

The above ingredients were heated to 60° C. for dissolution. To the resulting mixture after cooled to room temperature, 11 parts of the yellow pigment primary dispersion were added with stirring to give coating mixture 1 for the yellow image-forming layer.

4) Formation of the yellow image-forming layer

On the light-to-heat conversion layer, coating mixture 1 for the yellow image-forming layer was coated by means of wire bar, and dried at 100° C. for 3 min to give thermal transfer sheet Y comprising the yellow image-forming layer provided on the light-to-heat conversion layer.

The thickness of the yellow image-forming layer in the thermal transfer sheet Y was 0.4 μm on average.

The image-forming layer thus formed had the following physical properties.

The Smooster value of the surface, which should preferably be 0.5 to 50 mm Hg (≅0.0665 to 6.65 kPa), was 2.3 mm Hg (≅0.31 kPa).

The static frictional coefficient of the surface, which should preferably not exceed 0.2, was actually 0.15.

Example 1-2

Another thermal transfer sheet was prepared by repeating the procedures in EXAMPLE 1-1 except that the dispersion time for the yellow pigment primary dispersion was changed to 2 hours. The average particle size of the primary dispersion was 0.26 μm.

Comparative Example 1-1

Still another thermal transfer sheet was prepared by repeating the procedures in EXAMPLE 1-1 except that the

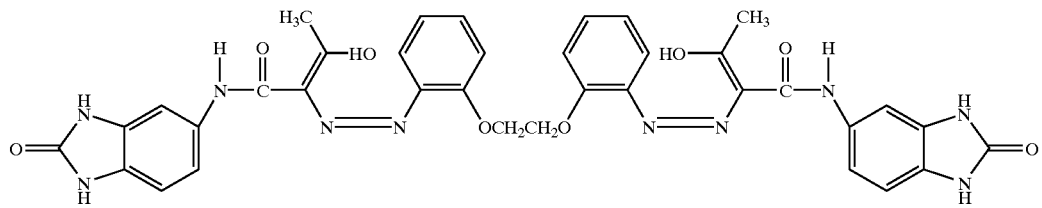

dispersion time for the yellow pigment primary dispersion was changed to 30 min. The average particle size of the primary dispersion was 0.61 µm.

Comparative Example 1-2

Still another thermal transfer sheet was prepared by repeating the procedures in EXAMPLE 1-1 except that the dispersion time for the yellow pigment primary dispersion was changed to 20 min. The average particle size of the primary dispersion was 0.89 µm.

Comparative Example 1-3

Still another thermal transfer sheet was prepared by repeating the procedures in EXAMPLE 1-1 except that the added amount of Solsperse 20000 was changed to 0.08 part and that the dispersion time was changed to 10 hr. The average particle size of the primary dispersion was 0.16 µm.

Example 1-3

A thermal transfer sheet was prepared by repeating the procedures in EXAMPLE 1-1 except that coating mixture 1 for the yellow image-forming layer was changed to coating mixture 2 for the yellow image-forming layer. However, the dispersion time for the yellow pigment primary dispersion in EXAMPLE 1-1 was changed to 30 min.

[Preparation of coating mixture 2 for the yellow image-forming layer]

| | |
|---|---|
| Poly (vinyl butyral) (Eslec BBL-SH, a product of Sekisui Chemical Co., Ltd.) | 0.3 parts |
| Rosin (KE-311, a product of Arakawa Chemical Industries, Ltd.) (Composition: 80 t 97% of resin acid. Composition of resin acid: abietic acid = 30 to 40%, neoabietic acid = 10 to 20%, dihydroabietic acid = 14% and tetrahydroabietic acid = 14%) | 0.2 parts |
| Behenic acid (NAA-222S, a product of NOF Corp.) | 0.2 parts |
| Surfactant (Megafac F-176PF, solid content: 20%, a product of Dainippon Ink and Chemicals, Inc.) | 0.1 parts |
| Monoglycerin ester of $C_{15}H_{31}COOH$ | 0.2 parts |
| Methyl ethyl ketone | 18 parts |
| n-Propyl alcohol | 70 parts |

The above ingredients were heated to 60° C. for dissolution. To the resulting mixture after cooled to room temperature, 11 parts of the yellow pigment primary dispersion were added with stirring to give coating mixture 2 for the yellow image-forming layer.

The performance of the thermal transfer sheet was evaluated by the following methods. The results are shown in Table 1.
Scratch Resistance
The method described hereinabove was adopted.
Performance of Thermal Transfer Sheet
Preparation of Image-receiving Sheet
Coating mixtures for the cushion layer and the image-forming layer of the following compositions were prepared.

1) Coating mixture for the cushion layer

| | |
|---|---|
| Vinyl chloride-vinyl acetate copolymer (main binder), (MPR-TSL, a product of Nisshin Chemical Co., Ltd.) | 20 parts |
| Plasticizer (Paraplex G-40 made by CP. Hall Co., Ltd.) | 10 parts |
| Surfactant (Megafac F-177 made by Dainippon Ink and Chemicals, Inc.) | 0.5 parts |
| Antistatic agent (a quaternary ammonium salt) (SAT-5 Supper (IC) made by Nippon Pure Chemical Co., Ltd.) | 0.3 parts |
| Methyl ethyl ketone | 60 parts |
| Toluene | 10 parts |
| N, N-dimethylformamide | 3 parts |

2) Coating mixture for the image-receiving layer

| | |
|---|---|
| Poly (vinyl butyral) (Eslec BBL-SH, a product of Sekisui Chemical Co., Ltd.) | 8.0 parts |
| Antistatic agent (Sanstat 2012A made by Sanyo Chemical Industries, Ltd.) | 0.7 parts |
| Surfactant (Megafac F-177, a product of Dainippon Ink and Chemicals, Inc.) | 0.1 parts |
| n-Propyl alcohol | 20 parts |
| Methanol | 20 parts |
| 1-Methoxy-2-propanol | 50 parts |

With use of a small size test coater, the coating mixture for the cushion layer prepared above was coated on a white 130-µm thick PET substrate (Lumilar E-58 made by Toray Corp.) and dried. Then, the coating mixture for the image-receiving layer was coated and dried. The coating conditions were regulated so as to give a thickness of about 20 µm for the cushion layer, and about 2 µm for the image-receiving layer, both on dry base. The white PET substrate consisted of a poly(ethylene terephthalate) base film containing minute voids at a void content of 20% and having a thickness of 116 µm, and titanium oxide-containing poly (ethylene terephthalate) surface layers (7 µm thick and containing the titanium oxide at 2% content) laminated on the both surfaces of the base film. The substrate had a total thickness of 130 µm and a specific gravity of 0.8. The finished film was wound up in the form of roll, stored at room temperature for one week, and then used for laser recording.

The image-receiving layer thus formed had the following physical properties.

Surface roughness Ra, which should preferably be 0.4 to 0.01 µm, was actually 0.02 µm.

The surface undulation, which preferably should not exceed 2 µm, was actually 1.2 µm.

The Smooster value of the surface, which should preferably be 0.5 to 50 mm Hg (≅0.0665 to 6.65 kPa) at 23° C., 55% RH, was actually 0.8 mm Hg (≅0.11 kPa).

The static frictional coefficient of the surface, which should preferably not exceed 0.4, was actually 0.37.
Formation of a Transferred Image The image-receiving sheet prepared above with an area of 56 cm×79 cm was wound around a rotary drum of 25 cm diameter that is provided with vacuum suction holes of 1 mm diameter at an area density of one hole per 3 cm×8 cm area, and tightly held thereon by means of vacuum absorption. Then the thermal transfer sheet prepared in EXAMPLE 1-1 cut in the size of 61 cm×84 cm was placed on the image-receiving sheet so that the latter sheet entirely covers the former with the peripheries evenly expanding outside the edges of the former sheet. A squeeze roller was used to squeeze the superposed sheets to help the air therebetween sucked and achieve an intimate contact of the sheets. The degree of pressure reduction for the state in which the suction holes were masked was −150 mm Hg relative to one atmospheric pressure (≅81.13 kPa). As the drum was rotated, 808 nm wavelength beams from semiconductor lasers, each of which was condensed to a 7 µm size spot on the surface of the light-to-heat conversion layer, were irradiated from the outside of the drum for image recording whereby the beam was moved (sub-scanned) in the direction perpendicular to that of drum rotation (main scanning). The laser irradiation conditions were as follows. The laser beams used in the present EXAMPLE were arranged two-dimensionally forming a parallelogram comprising five beams in the main scanning direction, and three beams in the sub-scanning direction.

| Laser power | 110 mW |
|---|---|
| Main scanning rate | 6 m/sec |
| Sub-scanning pitch | 6.35 µm |
| Atmospheric conditions | 18° C.-30% RH, 23° C.-50% RH and 26° C.-65% RH |

The laminated body after the laser recording was unloaded from the drum, and the thermal transfer sheet Y was manually peeled off from the image-receiving sheet. It was confirmed that the image-forming layer of the thermal transfer sheet Y was transferred only at the light-irradiated regions onto the image-receiving sheet.

The exposure drum, which should preferably have a diameter of at least 360 mm, was actually of 380 mm diameter.

In a similar manner, images were transferred from each thermal transfer sheet in the other EXAMPLES and REFERENCE EXAMPLES to the image-receiving sheet.

A solid image thus recorded having the area of 10 m$^2$ was visually inspected as for the number of image defect and the reflection optical density. Defects not smaller than 1 mm in length were judged image defects. The reflection optical density was measured with a TD-904 Macbeth densitometer (with a W filter). Just to make sure, there was no difference among all the samples in image quality and recording sensitivity.

TABLE 1

| Sample | Average Particle Size of Pigment (µm) | Slipping Agent | Scratch Resistance (g) | Number of Image Defect | Reflection Optical Density |
|---|---|---|---|---|---|
| Example 1-1 | 0.34 | None | 76 | 1 | 1.01 |
| Example 1-2 | 0.26 | None | 156 | 2 | 1.08 |
| Comp. Example 1-1 | 0.61 | None | 38 | 18 | 0.98 |
| Comp. Example 1-2 | 0.89 | None | 22 | 42 | 0.92 |
| Comp. Example 1-3 | 0.16 | None | 213 | 2 | 0.86 |
| Example 1-3 | 0.61 |  | 68 | 2 | 0.99 |

The table indicates that the samples in the EXAMPLES can record high-quality images containing few image defects and exhibiting sufficient optical densities.

Example 2-1
Preparation of Thermal Transfer Sheet K (Black)
Formation of Back Coating

| [Preparation of the coating mixture for the first back coating] | |
|---|---|
| Aqueous dispersion of an acrylic resin (Solid content: 20% by weight, Julimer ET410 made by Nippon Pure Chemical Co., Ltd.) | 2.0 parts |
| Antistatic agent (an aqueous dispersion of tin oxide-antimony oxide) (average particle size: 0.1 µm, solid content: 17% by weight) | 7 parts |
| Polyoxyethylene phenyl ether | 0.1 parts |
| Melamine compound (Sumitix resin M-3 made by Sumitomo Chemical Co., Ltd.) | 0.3 parts |
| Distilled water to make | 100 parts |

Formation of the First Back Coating

One surface of a biaxially elongated poly(ethylene terephthalate) film substrate (Ra is equal to 0.01 µm for the both surfaces.) with 75 µm thickness was subjected to a corona treatment. On the treated surface, the coating mixture for the first back coating was coated so as to give a dried thickness of 0.03 µm, and dried at 180° C. for 30 sec to give the first back coating. The Young's modulus of the substrate in machine direction was 450 kg/mM$^2$ ($\cong$4.4 GPa) while that in cross-machine direction was 500 kg/mm$^2$ ($\cong$4.9 GPa). The F-5 value of the substrate in machine direction was 10 Kg/mm$^2$ ($\cong$98 MPa) while that in cross-machine direction was 13 Kg/mm$^2$ ($\cong$127.4 MPa). The thermal contraction ratio of the substrate for the heating at 100° C. for 30 min was 0.3% in machine direction, and 0.1% in cross-machine direction. The fracture strength was 20 Kg/mm$^2$ ($\cong$196 MPa) in machine direction, and 25 Kg/mm$^2$ ($\cong$245 MPa) in cross-machine direction. The elastic modulus was 400 Kg/mm$^2$ ($\cong$3.9 GPa).

| [Preparation of the coating mixture for the second back coating] | |
|---|---|
| Polyolefin (solid content: 27% by weight, Chemipearl S-120 made by Mitsui Petrochemical Co., Ltd.) | 3.0 parts |
| Antistatic agent (an aqueous dispersion of tin oxide-antimony oxide) (average particle size: 0.1 µm, solid content: 17% by weight) | 2.0 parts |
| Colloidal silica (Snowtex C made by Nissan Chemical Industries, Ltd.) | 0.3 parts |
| Epoxy compound (Dinakol EX-6145B made by Nagase Kasei, Ltd.) | 0.3 parts |
| Distilled water to make | 100 parts |

The coating mixture for the second back coating was coated on the first back coating, and the coated film was dried at 170° C. for 30 sec to give the second back coating having a layer thickness of 0.03 µm on the first back coating.

1) Preparation of the coating mixture for the light-to-heat conversion layer

All the ingredients in the following composition were blended under stirring with a stirrer to give the coating mixture for the light-to-heat conversion layer.

Coating Composition for the Light-to-heat Conversion Layer

Infrared light absorbing dye (NK-2014, a cyanine dye of the structure shown below, and made by Nippon Kankoh Shikiso Co., Ltd.) 7.6 parts

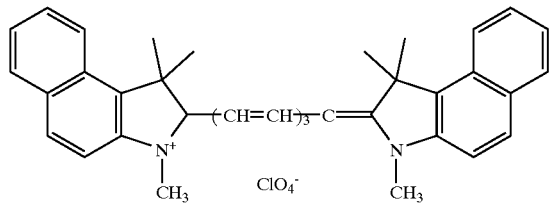

Polyimide resin of the following structure (with a thermal decomposition temperature of 510° C.) (Rikacoat SN-20F made by Shin-Nippon Rika Co., Ltd.) 29.3 parts

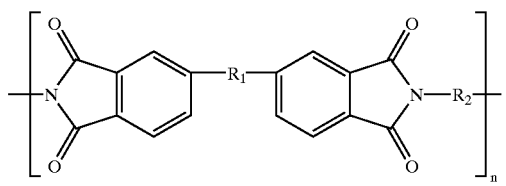

(In the structural formula, $R_1$ represents $SO_2$. $R_2$ represents the following formula.)

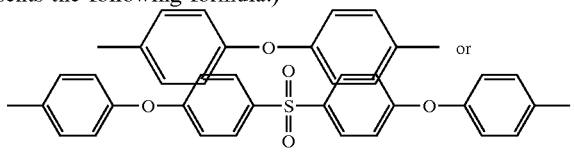

| | |
|---|---|
| Exxon Naphtha | 5.8 parts |
| N-methylpyrrolidone (NMP) | 1,500 parts |
| Methyl ethyl ketone | 360 parts |
| Fluorine-containing surfactant (Megafac F-176PF, solid content: 20%, a product of Dainippon Ink and Chemicals, Inc.) | 0.5 parts |
| Matting agent dispersion of the following composition | 14.1 parts |
| Matting agent dispersion | |
| N-methyl-2-pyrrolidone (NMP) | 69 parts |
| Methyl ethyl ketone | 20 parts |
| Styrene-acrylate resin (Johncryl 611, a product of Johnson Polymer Co., Ltd.) | 3 parts |
| Particulate $SiO_2$ (Seahoster KEP150 made by Nippon Catalyst, Ltd.) | 8 parts |

2) Formation of the light-to-heat conversion layer on the substrate.

On one surface of a 75 μm thick poly(ethylene terephthalate) film (substrate), the coating mixture for the light-to-heat conversion was coated by means of wire bar, and then dried in an oven kept at 120° C. for 2 min to give the light-to-heat conversion layer. The optical density of the resulting light-to-heat conversion layer at 808 nm was measured with a UV spectrometer UV-240 made by Shimadzu Corp. to give the value of 1.03. The thickness determined by observing the cross-section of the conversion layer with a scanning electron microscope was 0.3 μm on average.

3) Preparation of the coating mixture for the black image-forming layer

The following ingredients were charged in a kneader mill, and subjected to a pre-dispersion treatment by applying a shear force with the addition of a small quantity of solvent. To the resulting dispersion, an additional quantity of solvent was added to give a dispersion of the following composition, which was further dispersed in a sand mill for 2 hours to form a pigment primary dispersion.

| [Composition of the black pigment primary dispersion] | |
|---|---|
| Composition-1 | |
| Poly (vinyl butyral) (Eslec B BL-SH, a product of Sekisui Chemical Co., Ltd.) | 12.6 parts |
| Pigment black 7 (carbon black C. I. No. 77266) (PVC blackness: 1) (Mitsubishi Carbon Black #5 made by Mitsubishi Chemical Corp.) | 4.5 parts |
| Dispersing aid (Solsperse S-20000 made by ICI Corp.) | 0.8 parts |

| -continued | |
|---|---|
| [Composition of the black pigment primary dispersion] | |
| n-Propyl alcohol | 79.4 parts |
| Composition-2 | |
| Poly (vinyl butyral) (Eslec B BL-SH, a product of Sekisui Chemical Co., Ltd.) | 12.6 parts |
| Pigment black 7 (carbon black C. I. No. 77266) (PVC blackness: 10) (Mitsubishi Carbon Black MA100 made by Mitsubishi Chemical Corp.) | 10.5 parts |
| Dispersing aid (Solsperse S-20000 made by ICI Corp.) | 0.8 parts |
| n-Propyl alcohol | 79.4 parts |

Next, the following ingredients were blended with a stirrer to prepare the coating mixture for the black image-forming layer.

| [Composition of the coating mixture for the black image-forming layer] | |
|---|---|
| The black pigment primary dispersion prepared above (a mixture of Composition-1 and Composition-2 with the mixing ratio of 70:30) | 185.7 parts |
| Poly (vinyl butyral) (Eslec B BL-SH, a product of Sekisui Chemical Co., Ltd.) | 11.9 parts |
| Wax compound | |
| (Stearylamide, Newtron 2 made by Nippon Fine Chemical Co., Ltd.) | 1.7 parts |
| (Behenylamide, Diamide BM made by Nippon Kasei Chemical Co., Ltd.) | 1.7 parts |
| (Laurylamide, Diamide Y made by Nippon Kasei Chemical Co., Ltd.) | 1.7 parts |
| (Palmitylamide, Diamide KP made by Nippon Kasei Chemical Co., Ltd.) | 1.7 parts |
| (Elucylamide, Diamide L-200 made by Nippon Kasei Chemical Co., Ltd.) | 1.7 parts |
| (Oleylamide, Diamide O-200 made by Nippon Kasei Chemical Co., Ltd.) | 1.7 parts |
| Rosin (KE-311, a product of Arakawa Chemical Industries, Ltd.) (Composition: 80 to 97% of resin acid. Composition of resin acid: abietic acid = 30 to 40%, neoabietic acid = 10 to 20%, dihydroabietic acid = 14% and tetrahydroabietic acid = 14%) | 11.4 parts |
| Surfactant (Megafac F-176PF, solid content: 20% made by Dainippon Ink and Chemicals, Inc.) | 2.1 parts |
| Inorganic pigment (MEK-ST, 30% methyl ethyl ketone solution made by Nissan Chemical Industries, Ltd.) | 7.1 parts |
| Methyl ethyl ketone | 295 parts |

The particle size distribution of the pigment in the resulting coating mixture for the black image-forming layer was measured with a particle size analyzer based on laser scattering to give an average particle size of 0.25 μm where in the ratio of particles not smaller than 1 μm was 0.5%.

4) Formation of the black image-forming layer on the light-to-heat conversion layer The coating mixture for the black image-forming layer thus prepared was coated on the light-to-heat conversion layer by means of wire bar. Then, the coated product was dried in an oven kept at 100° C. for 2 min. In this way, the black image-forming layer was provided on the light-to-heat conversion layer, and the resulting sheet is called thermal transfer sheet K in which the light-to-heat conversion layer and the black image-forming layer are provided on the substrate in this order according to the procedures described heretofore. (Analogously, one having a yellow image-forming layer is called thermal transfer sheet Y, one having a magenta image-forming layer is called thermal transfer sheet M, and one having a cyan image-forming layer is called thermal transfer sheet C.)

The transmission optical density of the thermal transfer sheet K was measured with a TD-904 Macbeth densitometer (with a W filter) to give a value of 0.91. The thickness of the black image-forming layer was measured to give an averaged value of 0.60 μm.

The image-forming layers thus prepared had the following physical properties.

The scratch resistance of the image-forming layer was 200 g.

The Smooster value of the surface, which should preferably be 0.5 to 50 mm Hg (≅0.0665 to 6.65 kPa) at 23° C., 55% RH, was actually 9.3 mm Hg (≅1.24 kPa)

The static frictional coefficient of the surface, which should preferably not exceed 0.2, was actually 0.08.

Preparation of Thermal Transfer Sheet Y

Thermal transfer sheet Y was prepared by repeating the procedures for the preparation of thermal transfer sheet K except that the coating mixture for the black image-forming layer was replaced to that for the yellow image-forming layer. The image-forming layer of thermal transfer sheet Y thus prepared had a thickness of 0.42 μm.

The image-forming layers thus prepared had the following physical properties.

The scratch resistance of the image-forming layer was 200 g.

The Smooster value of the surface, which should preferably be 0.5 to 50 mm Hg (≅0.0665 to 6.65 kPa) at 23° C., 55% RH, was actually 2.3 mm Hg (≅0.31 kPa).

The static frictional coefficient of the surface, which should preferably not exceed 0.2, was actually 0.1.

Preparation of Thermal Transfer Sheet M

Thermal transfer sheet M was prepared by repeating the procedures for the preparation of thermal transfer sheet K except that the coating mixture for the black image-forming layer was replaced to that for the magenta image-forming layer. The image-forming layer of thermal transfer sheet M thus prepared had a thickness of 0.38 μm.

| [Composition of the yellow pigment primary dispersion] | |
|---|---|
| Yellow pigment dispersion composition-1 | |
| Poly (vinyl butyral) (Eslec B BL-SH, a product of Sekisui Chemical Co., Ltd.) | 7.1 parts |
| Pigment Yellow 180 (C. I. No. 21290) (Novoperm Yellow P-HG made by Clariant Japan K. K.) | 12.9 parts |
| Dispersing aid (Solsperse S-20000 made by ICI Corp.) | 0.6 parts |
| n-Propyl alcohol | 79.4 parts |
| Yellow pigment dispersion composition-2 | |
| Poly (vinyl butyral) (Eslec B BL-SH, a product of Sekisui Chemical Co., Ltd.) | 7.1 parts |
| Pigment Yellow 139 (C. I. No. 56298) (Novoperm Yellow M2R made by Clariant Japan K. K.) | 12.9 parts |
| Dispersing aid (Solsperse S-20000 made by ICI Corp.) | 0.6 parts |
| n-Propyl alcohol | 79.4 parts |
| Yellow pigment primary dispersion (a mixture of Yellow pigment composition-1 and yellow pigment composition-2 at the mixing rario of 95:5) | 126 parts |
| Poly (vinyl butyral) (Eslec B BL-SH, a product of Sekisui Chemical Co., Ltd.) | 4.6 parts |
| Wax compound | |
| (Stearylamide, Newtron 2 made by Nippon Fine Chemical Co., Ltd.) | 0.7 parts |
| (Behenylamide, Diamide BM made by Nippon Kasei Chemical Co., Ltd.) | 0.7 parts |
| (Laurylamide, Diamide Y made by Nippon Kasei Chemical Co., Ltd.) | 0.7 parts |
| (Palmitylamide, Diamide KP made by Nippon Kasei Chemical Co., Ltd.) | 0.7 parts |
| (Elucylamide, Diamide L-200 made by Nippon Kasei Chemical Co., Ltd.) | 0.7 parts |
| (Oleylamide, Diamide O-200 made by Nippon Kasei Chemical Co., Ltd.) | 0.7 parts |
| Nonionic surfactant (Chemistat 1100 made by Sanyo Chemical Industries, Ltd.) | 0.4 parts |
| Rosin (KE-311, a product of Arakawa Chemical Industries, Ltd.) | 2.4 parts |
| Surfactant (Megafac F-176PF, solid content: 20% made by Dainippon Ink and Chemicals, Inc.) | 0.8 parts |
| n-Propyl alcohol | 793 parts |
| Methyl ethyl ketone | 198 parts |

| [Composition of the magenta pigment primary dispersion] | |
| --- | --- |
| Magenta pigment dispersion composition-1 | |
| Poly(vinyl butyral) (Bicut softening point: 57° C.) (Denka Butyral #2000-L, a product of Denki Kagaku Kogyo K. K.) | 12.6 parts |
| Pigment Red 57:1 (C. I. No. 15850:1) (Symuler Brilliant Carmine 6B-229 made by Dainippon Ink and Chemicals, Inc.) | 15.0 parts |
| Dispersing aid (Solsperse S-20000 made by ICI Corp.) | 0.6 parts |
| n-Propyl alcohol | 80.4 parts |
| Magenta pigment dispersion composition-2 | |
| Poly(vinyl butyral) (Bicut softening point: 57° C.) (Denka Butyral #2000-L, a product of Denki Kagaku Kogyo K. K.) | 12.6 parts |
| Pigment Red 57:1 (C. I. No. 15850:1) (Lionol Red 6B-4290G, a product of Toyo Ink Mfg. Co., Ltd.) | 15.0 parts |
| Dispersing aid (Solsperse S-20000 made by ICI Corp.) | 0.6 parts |
| n-Propyl alcohol | 79.4 parts |
| [Composition of the coating mixture for the magenta image-forming layer] | |
| Magent pigment primary dispersion (a mixture of magent pigment composition-1 and magenta pigment composition-2 in the mixing ratio of 95:5) | 163 parts |
| Poly(vinyl butyral) (Bicut solftening point: 57° C.) (Denka Butyral #2000-L, a product of Denki Kagaku Kogyo K. K.) | 4.0 parts |
| Wax compound | |
| (Stearylamide, Newtron 2 made by Nippon Fine Chemical Co., Ltd.) | 1.0 part |
| (Behenylamide, Diamide BM made by Nippon Kasei Chemical Co., Ltd.) | 1.0 part |
| (Laurylamide, Diamide Y made by Nippon Kasei Chemical Co., Ltd.) | 1.0 part |
| (Palmitylamide, Diamide KP made by Nippon Kasei Chemical Co., Ltd.) | 1.0 part |
| (Elucylamide, Diamide L-200 made by Nippon Kasei Chemical Co., Ltd.) | 1.0 part |
| (Oleylamide, Diamide O-200 made by Nippon Kasei Chemical Co., Ltd.) | 1.0 part |
| Nonionic surfactant (Chemistat 1100 made by Sanyo Chemical Industries, Ltd.) | 0.7 parts |
| Rosin (KE-311, a product of Arakawa Chemical Industries, Ltd.) | 11.4 parts |
| Pentaerythritol tetraacrylate (NK Ester A-TMMT made by Shin Nakamura Kagaku, Ltd.) | 2.5 parts |
| Surfactant (Megafac F-176PF, solid content: 20% made by Dainippon Ink and Chemicals, Inc.) | 1.3 parts |
| Methyl ethyl ketone | 246 parts |

The image-forming layers thus prepared had the following physical properties.

The scratch resistance of the image-forming layer was 200 g.

The Smooster value of the surface, which should preferably be 0.5 to 50 mm Hg (≅0.0665 to 6.65 kPa) at 23° C., 55% RH, was actually 3.5 mm Hg (≅0.47 kPa).

The static frictional coefficient of the surface, which should preferably not exceed 0.2, was actually 0.08.

Preparation of Thermal Transfer Sheet C

Thermal transfer sheet C was prepared by repeating the procedures for the preparation of thermal transfer sheet K except that the coating mixture for the black image-forming layer was replaced to that for the cyan image-forming layer. The image-forming layer of thermal transfer sheet C had a thickness of 0.45 µm.

| [Composition of cyan pigment primary dispersion] | |
| --- | --- |
| Cyan pigment dispersion composition-1 | |
| Poly(vinyl butyral) (Eslec B BL-SH, a product of Sekisui Chemical Co., Ltd.) | 12.6 parts |
| Pigment Blue 15:4 (C. I. No. 74160) (Cyanine Blue 700-10FG made by Toyo Ink Mfg. Co., Ltd.) | 15.0 parts |
| Dispersing aid (PW-36 made by Kusumoto Kasei, Ltd.) | 0.8 parts |
| n-Propyl alcohol | 110 parts |
| Cyan pigment dispersion composition-2 | |
| Poly(vinyl butyral) (Eslec B BL-SH, a product of Sekisui Chemical Co., Ltd.) | 12.6 parts |
| Pigment Blue 15 (C. I. No. 74160) (Lionol Blue 7027 made by Toyo Ink Mfg. Co., Ltd.) | 15.0 parts |
| Dispersing aid (PW-36 made by Kusumoto Kasei, Ltd.) | 0.8 parts |
| n-Propyl alcohol | 110 parts |

| [Composition of the coating mixture for the cyan image-forming layer] | |
| --- | --- |
| Cyan pigment primary dispersion (a mixture of cyan pigment composition-1 and cyan pigment composition-2 in the mixing ratio of 90:10) | 118 parts |

-continued

[Composition of the coating mixture for the cyan image-forming layer]

| | |
|---|---|
| Poly(vinyl butyral) (Eslec B BL-SH, a product of Sekisui Chemical Co., Ltd.) | 5.2 parts |
| Inorganic pigment MEK-ST | 1.3 parts |
| Wax compound | |
| (Stearylamide, Newtron 2 made by Nippon Fine Chemical Co., Ltd.) | 1.0 part |
| (Behenylamide, Diamide BM made by Nippon Kasei Chemical Co., Ltd.) | 1.0 part |
| (Laurylamide, Diamide Y made by Nippon Kasei Chemical Co., Ltd.) | 1.0 part |
| (Palmitylamide, Diamide KP made by Nippon Kasei Chemical Co., Ltd.) | 1.0 part |
| (Elucylamide, Diamide L-200 made by Nippon Kasei Chemical Co., Ltd.) | 1.0 part |
| (Oleylamide, Diamide O-200 made by Nippon Kasei Chemical Co., Ltd.) | 1.0 part |
| Rosin (KE-311, a product of Arakawa Chemical Industries, Ltd.) | 2.8 parts |
| Pentaerythritol tetraacrylate (NK Ester A-TMMT made by Shin Nakamura Kagaku, Ltd.) | 1.7 parts |
| Surfactant (Megafac F-176PF, solid content: 20% made by Dainippon Ink and Chemicals, Inc.) | 1.7 parts |
| n-Propyl alcohol | 890 parts |
| Methyl ethyl ketone | 247 parts |

The image-forming layers thus prepared had the following physical properties.

The scratch resistance of the image-forming layer was 200 g.

The Smooster value of the surface, which should preferably be 0.5 to 50 mm Hg ($\cong$0.0665 to 6.65 kPa) at 23° C., 55% RH, was actually 7.0 mm Hg ($\cong$0.93 kpa).

The static frictional coefficient of the surface, which should preferably not exceed 0.2, was actually 0.08.

Preparation of the Image-receiving Sheet

Coating mixtures for the cushion layer and image-receiving layer were prepared which had the following compositions.

1) Coating mixture for the cushion layer

| | |
|---|---|
| Vinyl chloride/vinyl acetate copolymer (main binder) (MPR-TSL made by Nisshin Kagaku, Ltd.) | 20 parts |
| Plasticizer (Paraplex G-40 made by CP. Hall Co., Ltd.) | 10 parts |
| Fluorine-containing surfactant (coating aid) (Megafac F-177 made by Dainippon Ink and Chemicals, Inc.) | 0.5 parts |
| Antistatic agent (a quaternary salt) (SAT-5 Supper (IC) made by Nippon Pure Chemical Co., Ltd.) | 0.3 parts |
| Methyl ethyl ketone | 60 parts |
| Toluene | 10 parts |
| N,N-dimethylformamide | 3 parts |

2) Coating mixture for the image-receiving layer

| | |
|---|---|
| Poly(vinyl butyral) (EslecBBL-SH, a product of Sekisui Chemical Co., Ltd.) | 8.0 parts |
| Antistatic agent (Sanstat 2012A made by Sanyo Chemical Industries, Ltd.) | 0.7 parts |
| Surfactant (Megafac F-177 made by Dainippon Ink and Chemicals, Inc.) | 0.1 parts |
| n-Propyl alcohol | 20 parts |
| Methanol | 20 parts |
| 1-Methoxy-2-propanol | 50 parts |

With use of a small size test coater, the coating mixture for the cushion layer prepared above was coated on a white 130-$\mu$m thick PET substrate (Lumilar #130E58 made by Toray Corp.) and dried. Then, the coating mixture for the image-receiving layer was coated and dried. The coating conditions were regulated so as to give a thickness of about 20 $\mu$m for the cushion layer, and about 2 $\mu$m for the image-receiving layer, both on dry base. The white PET substrate consisted of a poly(ethylene terephthalate) base film containing minute voids at a void content of 20% and having a thickness of 116 $\mu$m, and titanium oxide-containing poly(ethylene terephthalate) surface layers (7 $\mu$m thick and containing the titanium oxide at 2% content) laminated on the both surfaces of the base film. The substrate had a total thickness of 130 $\mu$m and a specific gravity of 0.8. The finished film was wound up in the form of roll, stored at room temperature for one week, and then used for laser recording.

The image-receiving layer thus formed had the following physical properties.

Surface roughness Ra, which should preferably be 0.4 to 0.01 $\mu$m, was actually 0.02 $\mu$m.

The surface undulation, which preferably should not exceed 2 $\mu$m, was actually 1.2 $\mu$m.

The Smooster value of the surface, which should preferably be 0.5 to 50 mm Hg ($\cong$0.0665 to 6.65 kPa) at 23° C., 55% RH, was actually 0.8 mm Hg ($\cong$0.11 kPa).

The static frictional coefficient of the surface, which should preferably not exceed 0.8, was actually 0.37.

Formation of a Transferred Image

The image-receiving sheet prepared above with an area of 56 cm×79 cm was wound around a rotary drum of 25 cm diameter that is provided with vacuum suction holes of 1 mm diameter at an area density of one hole per 3 cm×8 cm area, and tightly held thereon by means of vacuum absorption. Then the thermal transfer sheet K (black) cut in the size of 61 cm×84 cm was placed on the image-receiving sheet so that the latter sheet entirely covers the former with the peripheries evenly expanding outside the edges of the former sheet. A squeeze roller was used to squeeze the superposed sheets to help the air there between sucked and achieve an intimate contact of the sheets. The degree of pressure reduction for the state in which the suction holes were masked was −150 mm Hg relative to one atmospheric pressure ($\cong$81.13 kPa). As the drum was rotated, 808 nm wavelength beams from semiconductor lasers, each of which was condensed to a 7 $\mu$m size spot on the surface of the light-to-heat conversion layer, were irradiated from the outside of the drum for image recording (to image and line areas) whereby the beams were moved (sub-scanned) in the direction perpendicular to that of drum rotation (main scanning). The laser irradiation conditions are as follows. The laser beams used in the present EXAMPLE were arranged two-dimensionally forming a parallelogram comprising five beams in the main scanning direction, and three beams in the sub-scanning direction.

| | |
|---|---|
| Laser power | 110 mW |
| Drum rotation | 500 rpm |
| Sub-scanning pitch | 6.35 $\mu$m |
| Atmospheric conditions | 23° C., 50% RH |

The exposure drum, which preferably should have a diameter of 360 mm or more, was actually of 380 mm diameter.

The size of the image was 515 mm×728 mm and the image resolution was 2600 dpi.

The laminated body after the laser recording was unloaded from the drum. A sample for peeling force measurement was prepared and subjected to the measurement according to the method described herein above. It was confirmed that the image-forming layer of the thermal transfer sheet K was transferred only at the light-irradiated regions onto the image-receiving sheet.

By the same procedures as described above, an image was transferred from each of the thermal transfer sheets Y, M and C onto the image-receiving sheet. Each laminated body was unloaded from the drum. Then, a sample for peeling force measurement was prepared and subjected to the measurement similarly. It was confirmed that the image-forming layer of each thermal transfer sheet was transferred only at the light-irradiated regions onto the image-receiving sheet.

With use of the thermal transfer sheets K, Y, M and C, an image was transferred in register onto the same piece of the image-receiving sheet in the same conditions as described above. In such a manner, a multi-color image corresponding to the printed matter to be reproduced was formed, which was then transferred onto a printing stock to give a defect-free, fine color proof.

Comparative Example 2-3

The preparation procedures of the thermal transfer sheet C in EXAMPLE 2-1 were repeated except that the added amount of pentaerythritol tetraacrylate in the coating mixture for the cyan image-forming layer was changed from 1.7 parts to 0, and that the added amount of inorganic pigment MEK-ST was changed from 1.3 to 5.0 parts. In the same manner as in EXAMPLE 2-1, the image formation by laser exposure and the measurements of peeling force before and after laser exposure were conducted.

Comparative Example 2-4

Instead of thermal transfer sheets Y, M, C and K in EXAMPLE 2-1, the following thermal transfer sheets Y*, M*, C* and K* were used for the image formation by laser exposure and the measurements of peeling force before and after laser exposure as in EXAMPLE 2-1.

Preparation of Thermal Transfer Sheets Y*, M*, C* and K*

On the substrate comprising a 100 μm thick poly(ethylene terephthalate) film (T100, #100 made by Diafoil-Hoechst, Ltd.), the coating mixture of the following composition was coated by means of reverse roll coater, and dried to give an inter-layer (cushion layer) with a dried thickness of 7 μm.

| (Coating mixture for the inter-layer) | |
|---|---|
| Styrene-ethylene-butene-styrene copolymer, SEBS (Clayton G1657 made by Shell Chemicals, Ltd.) | 14 parts |
| Tackifier (Super Ester A100 made by Arakawa Chemical Industries, Ltd.) | 6 parts |
| Methyl ethyl ketone | 10 parts |
| Toluene | 80 parts |

On the inter-layer, the coating mixture for the light-to-heat conversion layer was coated by means of wire bar, and dried to give a light-to-heat conversion layer with a transmission absorption of 0.8 at 810 nm wavelength. The mixture was prepared by first adding the pre-determined quantities of water and isopropyl alcohol to the PVA aqueous solution, and then slowly adding the carbon black dispersion in order to prevent the particles from growing.

| (Coating mixture for the light-to-heat conversion layer) | |
|---|---|
| Poly (vinyl alcohol) PVA (10% by weight aqueous solution of Gohsenol EG-30 made by the Nippon Synthetic Chemical Industry Co., Ltd.) | 63 parts |
| Carbon black dispersion | 9 parts |
| Water | 10 parts |
| Isopropyl alcohol | 18 parts |

On the light-to-heat conversion layer, the coating mixture for an image-forming layer of the following composition was coated so as to give a dried thickness of 0.5 to 0.55 μm to form an image-forming layer each colored in yellow, magenta, cyan or black. In these ways, thermal transfer sheets Y*, M*, C* and K* were prepared.

| (Coating mixture for the image-forming layer) | |
|---|---|
| Yellow image-forming layer | |
| Yellow pigment dispersion (a methyl ethyl ketone dispersion with 34% solid content and 30% pigment content) (MHI Yellow #608 made by Mikuni Dyestuff Corp.) | 15 parts |
| 40% by weight MEK solution of styrene/acrylate copolymer (Himer SBM73F made by Sanyo Chemical Industries, Ltd.) | 20.5 parts |
| 10% by weight MEK solution of ethylene-vinyl acetate copolymer EVA (EV-40Y made by Dupont-Mitsui Polychemicals Co., Ltd.) | 6.6 parts |
| Flurine-containing surfactant (Surflon S-382 made by Asahi Glass Co.) | 0.3 parts |
| Methyl ethyl ketone | 5.6 parts |
| Cyclohexanone | 17 parts |
| Magenta image-forming layer | |
| Magenta pigment dispersion (a methyl ethyl ketone dispersion with 23% solid content and 20% pigment content) (MHI Magenta #527 made by Mikuni Dyestuff Corp.) | 45 parts |
| 40% by weight MEK solution of styrene/acrylate copolymer (Himer SBM73F made by Sanyo Chemical Industries, Ltd.) | 24.1 parts |
| 10% by weight MEK solution of ethylene-vinyl acetate copolymer EVA (EV-40Y made by DuPont-Mitsui Polychemicals Co., Ltd.) | 8.8 parts |
| Fluroine-containing surfactant (Surflon S-382 made by Asahi Glass Co.) | 0.4 parts |
| Methyl ethyl ketone | 10.2 parts |
| Cyclohexanone | 12.8 parts |
| Cyan image-forming layer | |
| Cyan pigment dispersion (a methyl ethyl ketone dispersion with 35% solid content and 30% pigment content) (MHI Blue #454 made by Mikuni Dyestuff Corp.) | 14.5 parts |
| 40% by weight MEK solution of styrene/acrylate copolymer (Himer SBM73F made by Sanyo Chemical Industries, Ltd.) | 34.7 parts |
| 10% by weight MEK solution of ethylene-vinyl acetate copolymer EVA (EV-40Y made by DuPont-Mitsui Polychemicals Co., Ltd.) | 8.8 parts |
| Fluorine-containing surfactant (Surflon S-382 made by Asahi Glass Co.) | 0.4 parts |
| Methyl ethyl ketone | 20.0 parts |
| Cyclohexanone | 21.6 parts |
| Black image-forming layer | |
| Black pigment dispersion (a methyl ethyl ketone dispersion with 38% solid content and 33% pigment content) (MHI Black #220 made by Mikuni Dyestuff Corp.) | 14.5 parts |
| 40% by weight MEK solution of styrene/acrylate copolymer (Himer SBM73F made by Sanyo Chemical Industries, Ltd.) | 29.1 parts |
| 10% by weight MEK solution of ethylene-vinyl acetate copolymer EVA (EV-40Y made by DuPont-Mitsui Polychemicals Co., Ltd.) | 8.8 parts |

-continued (Coating mixture for the image-forming layer)

| | |
|---|---|
| Fluorine-containing surfactant (Surflon S-382 made by Asahi Glass Co.) | 0.3 parts |
| Methyl ethyl ketone | 24.5 parts |
| Cyclohexanone | 15.3 parts |

As in EXAMPLE 2-1, each of the thermal transfer sheets thus prepared was used for the formation of an image on the image-receiving sheet. The image was then transferred onto a printing stock, and the image quality was evaluated on the solid area and the line image area. The evaluation was visually conducted according to the following criteria.

Solid Area o: Neither space between scanning lines nor areas where incomplete image transfer took place exists.
Δ: Spaces between scanning lines and areas where incomplete image transfer took place locally exist.
X: Spaces between scanning lines and areas where incomplete image transfer took place exist throughout the image area.

Line Image Area o: The line images have sharp edges and are finely resolved.
Δ: The line images have ragged edges and bridging is locally observed.
X: Bridging is observed throughout the image area.

TABLE 2

| | Sample | Pre-exp. Peeling Force (N/m) | Post-exp. Peeling Force (N/m) | Image Quality of Transferred Image |
|---|---|---|---|---|
| Ex. 2-1 | Thermal Trans. Sheet Y | 10.1 | 3.2 | Solid: o<br>Line: o |
| | Thermal Trans. Sheet M | 3.5 | 1.7 | Solid: o<br>Line: o |
| | Thermal Trans. Sheet C | 12.5 | 4.6 | Solid: o<br>Line: o |
| | Thermal Trans. Sheet K | 53.6 | 2.6 | Solid: o<br>Line: o |
| Comp. Ex. 2-3 | Thermal Trans. Sheet C | 30.3 | 7.6 | Solid: X (Peeling-off of image-receiving layer during sheet separation)<br>Line: Δ (thinning of fine lines) |
| Comp. Ex. 2-4 | Thermal Trans. Sheet Y | 0.5 | 0.4 | Solid: o<br>Line: Δ (Transfer of finger-touching areas) |
| | Thermal Trans. Sheet M | 0.4 | 0.3 | Solid: o<br>Line: Δ (Transfer of finger-touching areas) |
| | Thermal Trans. Sheet C | 0.6 | 0.4 | Solid: o<br>Line: Δ (Transfer of finger-touching areas) |
| | Thermal Trans. Sheet K | 0.5 | 0.4 | Solid: o<br>Line: Δ (Transfer of finger-touching areas) |

Example 3-1

As the thermal transfer sheets of the image-forming material, the thermal transfer sheets K, Y, M and C used in Example 2-1 were used.

Preparation of Image-receiving Sheet

Coating mixtures for the cushion layer and image-receiving layer were prepared which had the following compositions.

1) Coating mixture for the cushion layer

| | |
|---|---|
| Vinyl chloride/vinyl acetate copolymer (main binder) (MPR-TSL made by Nisshin Kagaku, Ltd.) | 20 parts |
| Plasticizer (Paraplex G-40 made by CP. Hall Co., Ltd.) | 0.5 parts |
| Fluorine-containing surfactant (coating aid) (Megafac F-177 made by Dainippon Ink and Chemicals, Inc.) | 0.5 parts |
| Antistatic agent (a quaternary salt) (SAT-5 Supper (IC) made by Nippon Pure Chemical Co., Ltd.) | 0.3 parts |
| Methyl ethyl ketone | 60 parts |
| Toluene | 10 parts |
| N,N-dimethylformamide | 3 parts |

2) Coating mixture for image-receiving layer

| | |
|---|---|
| Poly(vinyl butyral) (EslecBBL-SH, a product of Sekisui Chemical Co., Ltd.) | 117.0 parts |
| Styrene-maleic acid half ester (binder) (Oxylac SH-128 made by Nippon Shokubai Co., Ltd.) | 63 parts |
| Antistatic agent (Chemistat 3033 made by Sanyo Chemical Industries, Ltd.) | 16 parts |
| PMMA (average particle size: 5 μm) | 3 parts |
| Surfactant (Megafac F-176PF made by Dainippon Ink and Chemicals, Inc.) | 1.2 parts |
| n-Propyl alcohol | 570 parts |
| Methanol | 1200 parts |
| 1-Methoxy-2-propanol | 520 parts |

With use of a wire bar coater, the coating mixture for the cushion layer prepared above was coated on a white 130-μm thick PET substrate (Lumilar #130E58 made by Toray Corp.) and dried. Then, the coating mixture for the image-receiving layer was coated and dried. The coating conditions were regulated so as to give a thickness of about 20 μm for the cushion layer, and about 2 μm for the image-receiving layer, both on dry base. The white PET substrate consisted of a poly(ethylene terephthalate) base film containing minute voids at avoid ratio of 20% and having a thickness of 116 μm, and titanium oxide-containing poly(ethylene terephthalate) surface layers (7 μm thick and containing the titanium oxide at 2% content) laminated on the both surfaces of the base film. The substrate had a total thickness of 130 μm and a specific gravity of 0.8. The finished film was wound up in the form of roll, stored at room temperature for one week, and then used for laser recording. The surface roughness Rz of the image-receiving sheet was measured according the method described hereinabove. The dynamic frictional force, stacking property and image quality of the image-receiving sheet were measured and evaluated in the methods to be shown below. The results are summarized in Table 3.

Dynamic Frictional Force Measurement

Two rectangular pieces of the image-receiving sheets having areas of 7 cm×16 cm (lower piece) and 5 cm×15 cm (upper piece) were cut. The two pieces were superimposed with both image-receiving layers arranged downward. The lower piece was fixed on a stand, while the upper sheet was attached to a force gauge DFG-2K made by Shimpo Co., Ltd. at one edge thereof. With 125 g weight (whose bottom was circular with 4 cm diameter.) placed thereon, the upper sheet was pulled at a rate of 1500 mm/min for 3 sec, and the averaged maximum value per one second designated by "MIN" was measured. The pulling was repeated five times, and the values were averaged.

A larger value means that the dynamic frictional force between the image-receiving surface and the back surface is larger.

Stacking Property Evaluation

The image-receiving sheet in the form of roll (with 558 mm width and an arbitrary length) was loaded in a Luxel FINALPROOF 5600, a printer made by Fuji Photo Film Co., Ltd., and passed through the printer without image recording to continuously stacking 20 sheets of B2 size (558×841 mm) lengthwise. The situation of the stacked sheets was evaluated.

o: good (orderly stacked)

X: poor (randomly stacked)

Evaluation of Image Quality

A transferred so-called halftone tint image was formed with use of the thermal transfer sheet M according to the process for transferred image formation to be described below. The image data used for image outputting are those for a 50% halftone tint (175 lines per inch square dots with the screen angle of 45 deg.). The output image was visually inspected with the naked eye and with use of a magnifier as for dot shape, dot missing and density uniformity.

o: good

X: poor

Formation of a Transferred Image

The image-receiving sheet prepared above with an area of 56 cm×79 cm was wound around a rotary drum of 25 cm diameter that is provided with vacuum suction holes of 1 mm diameter at an area density of one hole per 3 cm×8 cm area, and tightly held thereon by means of vacuum absorption. Then the thermal transfer sheet K prepared above cut in the size of 61 cm×84 cm was placed on the image-receiving sheet so that the latter sheet entirely covers the former with the peripheries evenly expanding outside the edges of the former sheet. A squeeze roller was used to squeeze the superposed sheets to help the air in-between sucked and achieve an intimate contact of the sheets. The degree of pressure reduction for the state in which the suction holes were masked was −150 mm Hg relative to one atmospheric pressure (≅81.13 kPa). As the drum was rotated, 808 nm wavelength beams from semiconductor lasers, each of which was condensed to a 7 $\mu$m size spot on the surface of the light-to-heat conversion layer, were irradiated from the outside of the drum for image recording whereby the beam was moved (sub-scanned) in the direction perpendicular to that of drum rotation (main scanning). The laser irradiation conditions are as follows. The laser beams used in the present EXAMPLE were arranged two-dimensionally forming a parallelogram comprising five beams in the main scanning direction, and three beams in the sub-scanning direction.

| Laser power | 110 mW |
| --- | --- |
| Drum rotation | 500 rpm |
| Sub-scanning pitch | 6.35 $\mu$m |
| Atmospheric conditions | 18° C.-30% RH, 23° C.-50% RH and 26° C.-65% RH |

The exposure drum, which should preferably have a diameter of at least 360 mm, was actually of 380 mm diameter.

The image size was 515 mm×728 mm, and the image resolution was 2,600 dpi.

The laminated body after the laser recording was unloaded from the drum, and the thermal transfer sheet K was manually peeled off from the image-receiving sheet. It was confirmed that the image-forming layer of the thermal transfer sheet K was transferred only at the light-irradiated regions onto the image-receiving sheet.

By the same procedures as described above, an image was transferred from each of the thermal transfer sheets Y. M and C onto the image-receiving sheet. The transferred 4-color image was further retransferred onto a recording paper as a printing stock. The image quality and density of the final multi-color image were consistently satisfactory even when the laser recording was carried out with use of two-dimensionally arranged multi-beams at a high energy level under various atmospheric conditions.

The image transfer onto the printing stock was conducted with use of a thermal transfer apparatus whose inserting tray was made of a material showing a dynamic frictional coefficient of 0.1 to 0.7 against poly(ethylene terephthalate). The transport velocity of the apparatus was 15 to 50 mm/sec. The Vickers hardness of the heating roll of the thermal transfer sheet should preferably be from 10 to 1000, and that of the actual apparatus was 70.

The images obtained under the three atmospheric conditions showed a satisfactorily high level of image quality.

Example 3-2

An image-receiving layer was prepared as in EXAMPLE 3-1 except that the PMMA particles (3 parts) were removed from the coating mixture for the image-receiving layer. A back coating was formed on the resulting image-receiving sheet in the following manner.

An 80:20 mixture of an acrylic polymer (A) and ammonium polystyrenesulfonate (B) was diluted with water to give a 4% by weight concentration. To the diluted mixture, PMMA particles with an average particle size of 8 $\mu$m were added by 3% by weight of the total solid weight of the coating mixture.

The acrylic polymer (A) consists of 50 mol % of methyl methacrylate and 50 mol % of ethyl acrylate, is introduced with 2.5 parts by weight of carboxyl group and 2.5 parts by weight of methylol group, and has an average molecular weight of 500,000.

The mixture was coated by means of wire bar and dried at 120° C. for 2 min. The average thickness of the back coating except the protrusions made of the PMMA particles was 0.5 $\mu$m according to the observation of the layer cross-section with an SEM.

Reference Example 3-2

An image-receiving sheet was prepared as in EXAMPLE 3-1 except that the average particle size of the PMMA particles was changed to 8 $\mu$m in the coating mixture for the image-receiving layer.

Reference Example 3-3

An image-receiving sheet was prepared as in EXAMPLE 3-1 except that the PMMA particles (3 parts) were removed from the coating mixture for the image-receiving layer.

In the image-receiving sheet, the following back coating was provided.

An 80:20 mixture of the acrylic polymer (A) and ammonium polystyrenesulfonate (B) was diluted with water to give a 4% by weight concentration. To the diluted mixture, PMMA particles with an average particle size of 12 $\mu$m were added by 3% by weight of the total solid weight of the coating mixture.

The mixture was coated by means of wire bar and dried at 120° C. for 2 min. The average thickness of the back coating except the protrusions made of the PMMA particles was 0.5 μm according to the observation of the layer cross-section with an SEM.

TABLE 3

| | Dynamic Frict. Force (gf) | Rz (μm) | | 20 Sheets | | Note |
|---|---|---|---|---|---|---|
| | | Image-receiving Surface | Back Surface | Stacking Behavior | Image Quality | |
| Ex. 3-1 | 36 | 3.3 | 0.6 | O | O | |
| Ex. 3-2 | 30 | 0.03 | 6.0 | O | O | |
| Reference Ex. 3-2 | 30 | 4.9 | 0.6 | O | X | Dot and fine line missing |
| Reference Ex. 3-3 | 27 | 0.03 | 9.5 | O | X | Non-uniform recording density |

The density of the images transferred under the three atmospheric conditions with use of the thermal transfer sheet K was measured with a Machbeth reflection densitometer RD-918 (with a W filter). The following results were obtained.

The image-forming layer of the thermal transfer sheet K was transferred onto the image-receiving sheet without conducting laser recording but instead with use of a thermal laminator. The obtained black image gave an optical density of 1.88 when measured by the method described above.

The ratios of image transfer by laser recording were 98.4%, 96.8% and 96.3% under the atmospheric conditions of 18° C.-30% RH, 23° C.-50% RH and 26° C.-65% RH, respectively.

The invention, which copes with the film less trend of the CTP era, can provide contract proofs that replace conventional press proofs and analog proofs. The proofs prepared by the invention can reproduce colors closely matching those of the printed matter that acts as the reference for customers' approval and of analog proofs. Moreover, the invention can provide DDCP systems which use pigment-based colorants common to those of printing inks, are capable of transfer onto actual printing stocks and providing proof images free of moires. Further, the materials of the invention are suited for large size (e.g., A2 to B2) digital direct color proof systems using actual printing stocks and pigment-based colorants, thus accurately simulating actual printed matters. The invention is suited for systems utilizing laser thermal transfer of thin films and reproducing halftone dot structures with use of pigment-based colorants. Systems associated with the invention do not undergo image resolution deterioration, and consistently output defect-free, high density multi-color images on image-receiving sheets even when the laser recording is conducted with use of a two-dimensionally arranged multi-beam laser with a high energy density under widely fluctuating atmospheric conditions. Moreover, according to the invention, image defect generation is prevented during the handling of the thermal transfer sheet, the conveyance and stacking properties of the image-receiving sheet improve, and hence a high process consistency is secured.

The entire disclosure of each and every foreign patent application from which the benefit of foreign priority has been claimed in the present application is incorporated herein by reference, as if fully set forth.

What is claimed is:

1. An image-forming material comprising:

an image-receiving sheet comprising a support and an image-receiving layer; and a thermal transfer sheet comprising a support, a light-to-heat conversion layer and an image-forming layer, wherein the outermost surface of the side of the thermal transfer sheet in which the image-forming layer is provided has a scratch resistance of from 50 g to 200 g at the time that the surface is scratched with a stylus having a radius of curvature of 0.25 mm at a velocity of 1 cm/sec.

2. The image-forming material according to claim 1, wherein the scratch resistance is from 100 g to 200 g.

3. The image-forming material according to claim 1, wherein an area of an image formed on the image-forming layer is at least 1000 $cm^2$.

4. The image-forming material according to claim 1, wherein the thermal transfer sheet is used to form a color image on the image-receiving sheet.

5. The image-forming material according to claim 1, wherein the outermost surface is that of the image-forming layer.

6. The image-forming material according to claim 1, wherein the light-to-heat conversion layer comprises carbon black.

7. An image-forming material comprising:

an image-receiving sheet comprising a support and an image-receiving layer; and a thermal transfer sheet comprising a support, a light-to-heat conversion layer and an image-forming layer, wherein the peeling force in relation to the light-to-heat conversion layer and the image-forming layer is less than 5.9 N/m on the condition that the light-to-heat conversion layer is peeled off from the image-forming layer with a peeling angle of 90° and at a peeling velocity of 500 mm/min after that;

the image-receiving sheet is superposed on the thermal transfer sheet to be in a state of the image-receiving layer being in contact with the image-forming layer; and the superposed body is subjected to laser light irradiation from the support side of the thermal transfer sheet after the superposing.

8. The image-forming material according to claim 7, wherein the peeling force is at least 0.5 N/m.

9. The image-forming material according to claim 8, wherein the peeling force before the superposing is larger than the peeling force after the superposing and the irradiation.

10. The image-forming material according to claim 7, wherein the peeling force in relation to the light-to-heat conversion layer and the image-forming layer is at least 0.98 N/m on the condition that the light-to-heat conversion layer is peeled off from the image-forming layer with a peeling angle of 90° and at a peeling velocity of 500 mm/min before the superposing.

11. The image-forming material according to claim 1, wherein the image-receiving sheet has an image-receiving surface having the image-receiving layer and a back surface that is opposite to the image-receiving surface; a dynamic frictional force in relation to the image-receiving surface and the back surface is 40 gf or less; and a surface roughness Rz of the image-receiving surface is 4 $\mu$m or less and a surface roughness Rz of the back surface is 8 $\mu$m or less.

12. The image-forming material according to claim 1, wherein the surface roughness Rz of the image-receiving surface is 3 $\mu$m or less and the surface roughness Rz of the back surface is 5 $\mu$m or less.

13. A method for forming an image comprising the steps of:

preparing the image-forming material according to claim 1, which comprises at least four thermal transfer sheets each comprising a support, a light-to-heat conversion layer and an image-forming layer, the at least four thermal transfer sheets comprising yellow, magenta, cyan and black thermal transfer sheets;

superposing each one of the at least four thermal transfer sheets on the image-receiving sheet to be in a state of the image-forming layer being in contact with the image-receiving layer; and irradiating the thermal transfer sheet with a laser beam to transfer an image in an area of the image-forming layer subjected to irradiation onto the image-receiving layer.

14. The method for forming a color proof comprising the steps of:

forming a multicolor image on the image-receiving layer by the method according to claim 13; and transferring the multicolor image together with the image-receiving layer onto a printing paper.

* * * * *